United States Patent
Ohshima et al.

(10) Patent No.: US 12,088,080 B2
(45) Date of Patent: Sep. 10, 2024

(54) ARC DETECTION DEVICE, SOLAR INVERTER, INDOOR WIRING SYSTEM, BREAKER, SOLAR PANEL, SOLAR PANEL-ATTACHED MODULE, AND JUNCTION BOX

(71) Applicant: Panasonic Intellectual Property Management Co., Ltd., Osaka (JP)

(72) Inventors: Kazuya Ohshima, Osaka (JP); Tatsuo Koga, Osaka (JP); Keita Kanamori, Osaka (JP); Kazunori Kidera, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 181 days.

(21) Appl. No.: 17/802,632

(22) PCT Filed: Mar. 3, 2021

(86) PCT No.: PCT/JP2021/008293
§ 371 (c)(1),
(2) Date: Aug. 26, 2022

(87) PCT Pub. No.: WO2021/182260
PCT Pub. Date: Sep. 16, 2021

(65) Prior Publication Data
US 2023/0011371 A1    Jan. 12, 2023

(30) Foreign Application Priority Data

Mar. 11, 2020    (JP) ................. 2020-041708

(51) Int. Cl.
*H02H 7/00*    (2006.01)
*H02H 1/00*    (2006.01)
*H02H 7/20*    (2006.01)

(52) U.S. Cl.
CPC ............ *H02H 1/0015* (2013.01); *H02H 7/20* (2013.01)

(58) Field of Classification Search
None
See application file for complete search history.

(56) References Cited

U.S. PATENT DOCUMENTS

| | | | |
|---|---|---|---|
| 11,923,670 B2* | 3/2024 | Koga | H02H 7/20 |
| 2008/0080106 A1* | 4/2008 | Mirafzal | H02M 1/12 |
| | | | 361/42 |

(Continued)

FOREIGN PATENT DOCUMENTS

| | | |
|---|---|---|
| JP | 2011-7765 A | 1/2011 |
| JP | 2012-145363 A | 8/2012 |

(Continued)

OTHER PUBLICATIONS

Extended European Search Report for corresponding European Application 21767090.0, dated Aug. 16, 2023.

(Continued)

*Primary Examiner* — Stephen W Jackson
(74) *Attorney, Agent, or Firm* — Renner, Otto, Boisselle & Sklar, LLP

(57) ABSTRACT

An arc detection device includes: a current detector that includes a magnetic core penetrated by first and second paths each connecting a DC power source and a device, and detects a current flowing through each of the first and second paths in accordance with a magnetic field generated at the magnetic core; a low impedance circuit having a lower impedance than the DC power source and the device, the low impedance circuit being connected to the first path and the second path to cause a high frequency component to bypass one of the first path or the second path; and an arc determiner that determines an occurrence of an arc based on a current detected by the current detector. In the magnetic (Continued)

core, a direct current flows through the first path in a direction opposite to a direction in which a direct current flows through the second path.

13 Claims, 15 Drawing Sheets

(56) References Cited

U.S. PATENT DOCUMENTS

| | | | |
|---|---|---|---|
| 2014/0210485 A1* | 7/2014 | Lang | H01H 9/50 |
| | | | 324/538 |
| 2017/0146589 A1 | 5/2017 | Li et al. | |
| 2018/0048138 A1 | 2/2018 | Macerini | |
| 2018/0210022 A1 | 7/2018 | Tomita et al. | |
| 2020/0182921 A1* | 6/2020 | Jakupi | H02H 1/0007 |
| 2021/0035750 A1 | 2/2021 | Miyamoto et al. | |

FOREIGN PATENT DOCUMENTS

| | | |
|---|---|---|
| JP | 2017-96913 A | 6/2017 |
| JP | 2017-161240 A | 9/2017 |
| JP | 2017-161241 A | 9/2017 |
| JP | 2017-161242 A | 9/2017 |
| JP | 2018-72320 A | 5/2018 |
| JP | 2018-119805 A | 8/2018 |
| JP | 2019-71708 A | 5/2019 |
| JP | 2020-139925 A | 9/2020 |
| WO | 2019/198791 A1 | 10/2019 |

OTHER PUBLICATIONS

International Search Report for corresponding Application No. PCT/JP2021/008293, mailed May 25, 2021.
Written Opinion for corresponding Application No. PCT/JP2021/008293, mailed May 25, 2021.

* cited by examiner

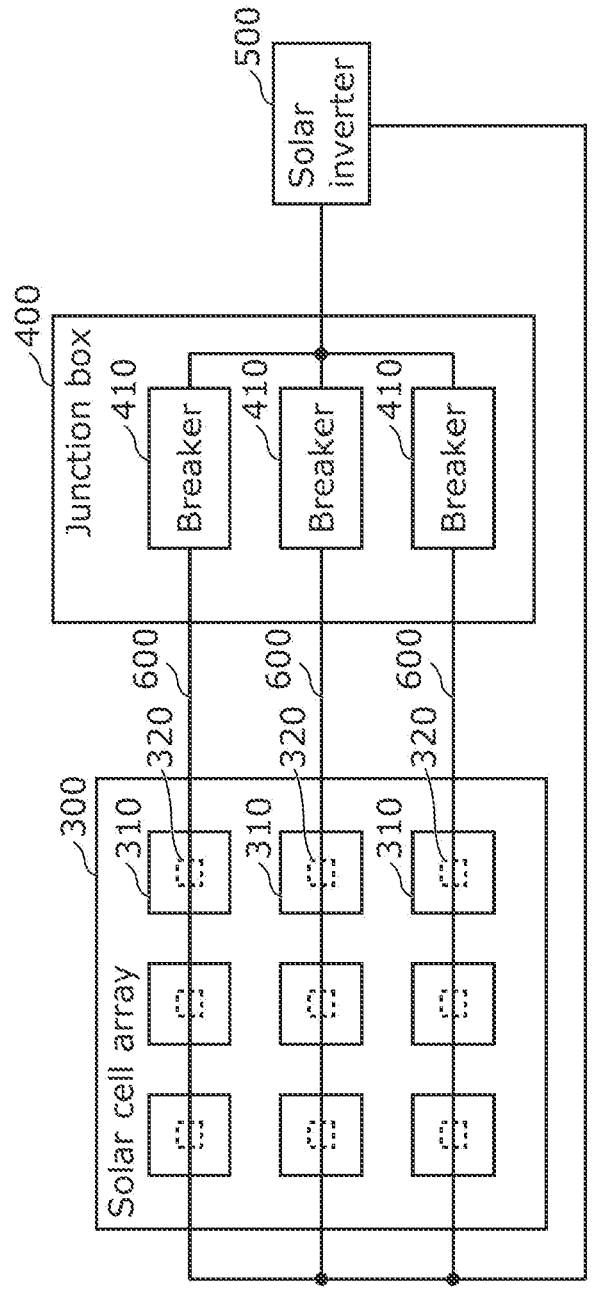

ARC DETECTION DEVICE, SOLAR INVERTER, INDOOR WIRING SYSTEM, BREAKER, SOLAR PANEL, SOLAR PANEL-ATTACHED MODULE, AND JUNCTION BOX

TECHNICAL FIELD

The present invention relates to an arc detection device, a solar inverter, an indoor wiring system, a breaker, a solar panel, a solar panel-attached module, and a junction box.

BACKGROUND ART

Typically known is a system that convers direct current (DC) power fed from a photovoltaic (PV) panel (i.e., a solar panel) via a wire into alternating current (AC) power, using a device such as an inverter. There are reports that such a wire is damaged or broken by external factors, aging, or other reasons. Such a damage or any other problem of the wire may cause an arc (i.e., an arc discharge). Arc detection means for detecting an arc are suggested (e.g., Patent Literature (PTL) 1).

CITATION LIST

Patent Literature

[PTL 1] Japanese Unexamined Patent Application Publication No. 2011-7765

SUMMARY OF INVENTION

Technical Problem

There is a method of detecting a magnetic field generated at a current sensor using a current flowing through a wire and detecting an arc based on the current corresponding to the magnetic field. This method may cause however magnetic saturation in a magnetic core of the current sensor and thus fail to detect an arc accurately.

To address the problem, it is an objective of the present invention to provide an arc detection device, for example, capable of detecting an arc accurately.

Solution to Problem

An arc detection device according to an aspect of the present invention includes: a current detector that includes a magnetic core penetrated by a first path and a second path each connecting a direct current (DC) power source and a device, and detects a current flowing through each of the first path and the second path in accordance with a magnetic field generated at the magnetic core; a low impedance circuit having a lower impedance than impedances of the DC power source and the device, the low impedance circuit being connected to the first path and the second path to cause a high frequency component to bypass one of the first path or the second path; and an arc determiner that determines an occurrence of an arc based on the current detected by the current detector. In the magnetic core, a direct current flows through the first path in a direction opposite to a direction in which a direct current flows through the second path.

A solar inverter according to an aspect of the present invention includes: the arc detection device described above; and a converter that converts electric power output from the DC power source.

An indoor wiring system according to an aspect of the present invention includes: the arc detection device described above; the first path; the second path; and the device placed indoors.

A breaker according to an aspect of the present invention includes the arc detection device described above. The breaker blocks a current flowing through each of the first wire and the second wire, when an occurrence of an arc is determined.

A solar panel according to an aspect of the present invention includes the arc detection device described above. The solar panel generates electricity from sunlight.

A solar panel-attached module according to an aspect of the present invention includes the arc detection device. The solar panel-attached module converts a signal output from a solar panel.

A junction box according to an aspect of the present invention includes the arc detection device described above. The junction box connects a solar panel and a solar inverter.

Advantageous Effects of Invention

An aspect of the present invention allows accurate detection of an arc.

BRIEF DESCRIPTION OF DRAWINGS

FIG. 11 illustrates an example application of the arc detection device according to the present invention.

DESCRIPTION OF EMBODIMENTS

Now, embodiments of the present invention will be described with reference to the drawings. The embodiments described below are specific examples of the present invention. The numerical values, shapes, materials, constituent elements, the arrangement and connection of the constituent elements etc. shown in the following embodiments are thus mere examples and are not intended to limit the scope of the present invention.

The figures are schematic representations and not necessarily drawn strictly to scale. In the figures, substantially the same constituent elements are assigned with the same reference marks, and redundant descriptions will be omitted or simplified.

Embodiment 1

Figure 1A:
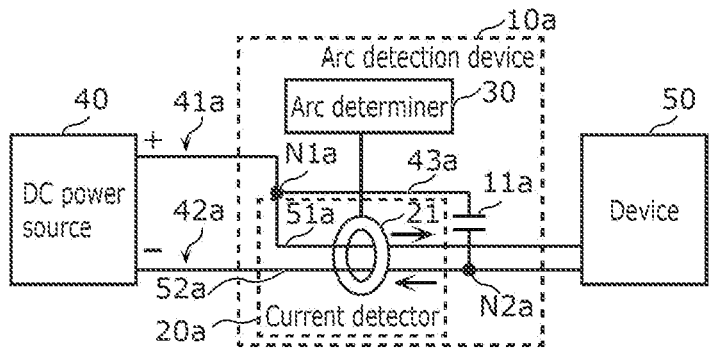
FIG. 1A is a configuration diagram showing an example arc detection device according to Embodiment 1.

FIG. 1A is a configuration diagram showing example arc detection device 10a according to Embodiment 1. Note that FIG. 1A also shows DC power source 40 and device 50.

DC power source 40 generates DC power. The DC power generated by DC power source 40 is fed to device 50. DC power source 40 includes a positive electrode and a negative electrode. The positive electrode is connected to wire 41a, while the negative electrode is connected to wire 42a. Via wires 41a and 42a, DC power source 40 feeds the DC power to device 50.

Device 50 is fed with DC power from DC power source 40 via wires 41a and 42a. The type of device 50 is not particularly limited. For example, device 50 may be a converter such as a DC/DC converter or may be a device, such as lighting equipment, a speaker, or a microphone, placed indoors.

Wires 41a and 42a connect DC power source 40 and device 50. Wire 41a is an example of the "first wire" connected to one of the positive and negative electrodes of DC power source 40. Here, wire 41a is connected to the positive electrode as the one of the positive and negative electrodes of DC power source 40. Wire 42a is an example of the "second wire" connected to the other of the positive and negative electrodes of DC power source 40. Here, wire 42a is connected to the negative electrode as the other of the positive and negative electrodes of DC power source 40.

Wires 41a and 42a penetrate magnetic core 21 which will be described later. A part (i.e., a path) of wire 41a penetrating magnetic core 21 is referred to as "path 51a", while a part (i.e., a path) of wire 42a penetrating magnetic core 21 is referred to as "path 52a". Passing through wire 41a connecting DC power source 40 and device 50, path 51a can also be regarded as connecting DC power source 40 and device 50. Path 51a is an example of the "first path" connecting DC power source 40 and device 50. Passing through wire 42a connecting DC power source 40 and device 50, path 52a can also be regarded as connecting DC power source 40 and device 50. Path 52a is an example of the "second path" connecting DC power source 40 and device 50.

In magnetic core 21, a direct current flows through path 51a in a direction opposite to the direction in which a direct current flows through path 52a. Path 51a passes through wire 41a connected to the positive electrode of DC power source 40, while path 52a passes through wire 42a connected to the negative electrode of DC power source 40. From the fact, it is also clear that a direct current flows through path 51a in a direction opposite to the direction in which a direct current flows through path 52a. In FIG. 1A, the direction in which a direct current flows through path 51a and the direction in which a direct current flows through path 52a are indicated by arrows near magnetic core 21.

Arc detection device 10a is for detecting an arc and includes low impedance circuit 11a, current detector 20a, and arc determiner 30

Current detector 20a includes magnetic core 21 penetrated by paths 51a and 52a and detects currents flowing through paths 51a and 52a in accordance with the magnetic field generated in magnetic core 21.

Magnetic core 21 is in a loop shape (e.g., a ring shape here) to be penetrated by one or more wires. A current flowing through the wire(s) penetrating the core hole generates the magnetic field corresponding to the current at the core. Note that magnetic core 21 is not limited to a ring shape but may be in a rectangular loop shape or any other suitable shape.

Current detector 20a also includes, for example, a Hall element (not shown) that detects the magnetic field generated in magnetic core 21 and produces a voltage corresponding to the magnetic field generated in magnetic core 21. A voltage produced by the Hall element is, as a signal indicating the magnetic field generated in magnetic core 21, that is, a current flowing through each path penetrating magnetic core 21, input to arc determiner 30.

Low impedance circuit 11a has a lower impedance than impedances of DC power source 40 and device 50. Low impedance circuit 11a is connected to paths 51a and 52a so that a high frequency component bypasses one of paths 51a and 52a. Low impedance circuit 11a is, for example, a capacitor with a lower impedance than impedances of the capacitance components of DC power source 40 and device 50. Since the capacitor functions to block DC components, only a high frequency component can be extracted from a signal flowing through each of wires 41a and 42a. The capacitance value of the capacitor is determined as appropriate in accordance with the frequency or other characteristics of a high frequency component to be extracted. Since low impedance circuit 11a has a lower impedance than impedances of DC power source 40 and device 50, a high frequency component easily flows toward low impedance circuit 11a through wires 41a and 42a.

Specifically, low impedance circuit 11a is placed in bypass path 43a connecting connection points N1a and N2a. Connection point N1a is located on wire 41a between one of the positive and negative electrodes (the positive electrode here) of DC power source 40 and magnetic core 21. Connection point N2a is located on wire 42a between magnetic core 21 and device 50.

Arc determiner 30 is a microcontroller, for example. The microcontroller is a semiconductor integrated circuit or any other suitable device including a ROM and/or a RAM storing programs, a processor (e.g., a central processing unit (CPU)) for executing the programs, a timer, an A/D converter, a D/A converter, and other components. Arc determiner 30 may be implemented as hardware by a dedicated electronic circuit including an A/D converter, a logic circuit, a gate array, a D/A converter, and other components.

Arc determiner 30 determines the occurrence of an arc based on a current detected by current detector 20a. For example, arc determiner 30 performs frequency analysis of a current detected by current detector 20a to determine the occurrence of an arc in wire 41a or 42a. A current, on which a high frequency component caused by the occurrence of the arc is superimposed, contains a frequency component caused by the arc. By detecting the frequency component, the occurrence of the arc can be determined.

Providing magnetic core 21 to be penetrated by only one of wires 41a and 42a (e.g., only wire 41a) is typically conceivable. In this case, however, a large direct current flows from DC power source 40 through wire 41a, which may cause magnetic saturation in magnetic core 21. Accordingly, at the occurrence of an arc in wire 41a, the magnetic saturation caused by a direct current may hinder accurate detection of a high frequency component of the arc superimposed on the direct current flowing through wire 41a.

On the other hand, assume that magnetic core 21 is provided to be penetrated simply by both wires 41a and 42a. In this case, a current flows through wire 41a in a direction opposite to the direction in which a current flowing through wire 42a. The magnetic field generated by the direct current flowing through wire 41a and the magnetic field generated by the direct current flowing through wire 42a cancel each other to reduce the magnetic saturation. However, the magnetic field generated by the high frequency component based on the occurrence of an arc is also canceled, which leads to difficulty in detecting the occurrence of an arc.

To address the problem, arc detection device 10 includes low impedance circuit 11a in bypass path 43a connecting connection points N1a and N2a. Connection point N1a is located on wire 41a between one of the positive and negative electrodes (the positive electrode here) of DC power source 40 and magnetic core 21. Connection point N2a is located on wire 42a between magnetic core 21 and device 50.

Low impedance circuit (e.g., capacitor) 11a is an element that blocks direct currents and allows alternating currents (i.e., high frequency components) to pass. Low impedance circuit 11a allows a high frequency component contained in a current flowing through wire 41a or 42a to flow to bypass path 43a. The principle that arc detection device 10a achieves accurate detection of an arc by including such low impedance circuit 11a will be described with reference to FIGS. 1B and 1C.

Figure 1B:
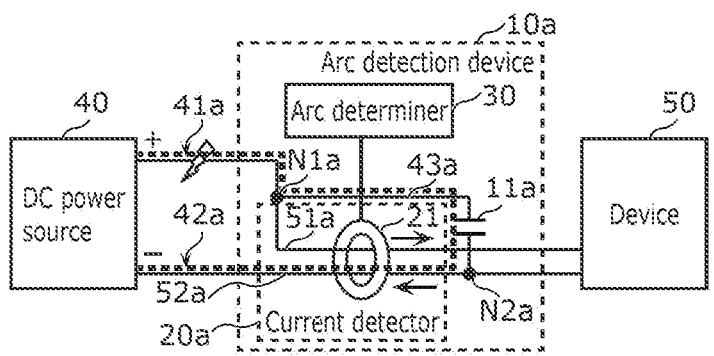
FIG. 1B shows example currents flowing through wires in the arc detection device according to Embodiment 1 at the occurrence of an arc.
Figure 1C:
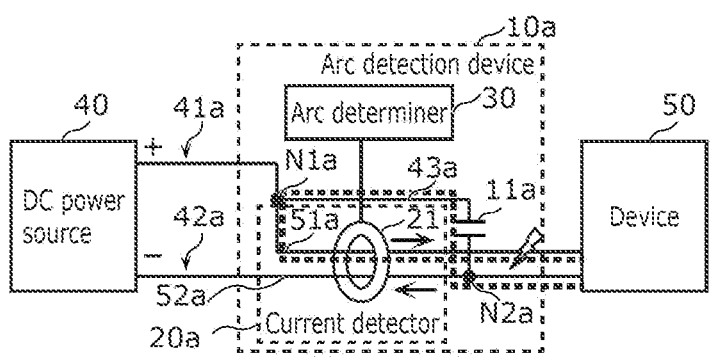
FIG. 1C shows example currents flowing through wires in the arc detection device according to Embodiment 1 at the occurrence of an arc.

FIGS. 1B and 1C each shows example currents flowing through wires in arc detection device 10a according to Embodiment 1 at the occurrence of an arc. FIG. 1B assumes that an arc occurs in wire 41a between the positive electrode of DC power source 40 and connection point N1a. FIG. 1C assumes that an arc occurs in wire 42a between device 50 and magnetic core 21. In FIGS. 1B and 1C, a bold broken line represents a flow of a high frequency component caused by the occurrence of the arc.

As described above, the magnetic field generated by a direct current flowing through path 51a and the magnetic field generated by a direct current flowing through path 52a in magnetic core 21 cancel each other to reduce magnetic saturation. In addition, these direct currents do not flow to bypass path 43a due to low impedance circuit (capacitor) 11a that blocks direct currents.

First, the principle of allowing accurate detection of an arc occurring on wire 41a between the positive electrode of DC power source 40 and connection point N1a as shown in FIG. 1B will be described.

A high frequency component generated by the arc flows to bypass path 43a at connection point N1a. This is because the high frequency component attempts to flow not through path 51a connecting connection point N1a and device 50 but through bypass path 43a provided with low impedance circuit 11a. The high frequency component then flows through path 52a connecting connection point N2a and DC power source 40. In this manner, bypass path 43a serves as a path that bypasses path 51a so that the high frequency component flows through path 52a but not through path 51a in magnetic core 21. Accordingly, in magnetic core 21, the magnetic field corresponding to a direct current flowing through path 51a and the magnetic field corresponding to a direct current flowing through path 52a cancel each other. As a result, the magnetic field corresponding to the high frequency component flowing through path 52a is generated. The magnetic field is output as a voltage signal to arc determiner 30 by a Hall element, for example. Based on the voltage signal, arc determiner 30 determines the occurrence of the arc.

Next, the principle of allowing accurate detection of an arc occurring on wire 42a between device 50 and magnetic core 21 as shown in FIG. 1C will be described.

A high frequency component generated by the arc flows through path 51a in magnetic core 21 and flows to bypass path 43a at connection point N1a. This is because the high frequency component attempts to flow not through a path connecting connection point N1a and DC power source 40 but through bypass path 43a provided with low impedance circuit 11a. The high frequency component then flows through a path connecting connection point N2a and device 50. In this manner, bypass path 43a serves as a path that bypasses path 52a so that the high frequency component flows through path 51a but not through path 52a in magnetic core 21. Accordingly, in magnetic core 21, the magnetic field corresponding to a direct current flowing through path 51a and the magnetic field corresponding to a direct current flowing through path 52a cancel each other. As a result, the magnetic field corresponding to the high frequency component flowing through path 51a is generated. The magnetic field is output as a voltage signal to arc determiner 30 by a Hall element, for example. Based on the voltage signal, arc determiner 30 determines the occurrence of the arc.

As described above, arc detection device 10a according to this embodiment includes current detector 20a that includes magnetic core 21 penetrated by a first path (e.g., path 51a) and a second path (e.g., path 52a) each connecting DC power source 40 and device 50, and detects currents flowing through the first path and the second path in accordance with the magnetic field generated in magnetic core 21; low impedance circuit 11a having a lower impedance than impedances of and DC power source 40 and device 50, low impedance circuit 11a being connected to the first path and the second path to cause a high frequency component to bypass one of the first path and the second path; and arc determiner 30 that determines an occurrence of an arc based on the current detected by current detector 20a. In magnetic core 21, a direct current flows through the first path in a direction opposite to a direction in which a direct current flows through the second path.

With this configuration, both the first and second paths, through which direct currents flow in opposite directions, penetrate magnetic core 21. The magnetic field generated by a direct current flowing through the first path and the magnetic field generated by a direct current flowing through the second path in magnetic core 21 cancel each other to reduce magnetic saturation. In addition, since low impedance circuit 11a is provided to cause a high frequency component generated by an arc to bypass one of the first path and the second path, the high frequency component generated by the arc is not canceled. As a result, the arc is detected accurately.

For example, DC power source 40 may feed electric power to device 50 via a first wire (e.g., wire 41a) and a second wire (e.g., wire 42a). The first wire (e.g., wire 41a) is connected to one of a positive electrode and a negative electrode of DC power source 40. The second wire (e.g., wire 42a) is connected to the other of the positive electrode and the negative electrode of DC power source 40. The first path may pass through the first wire. The second path may pass through the second wire.

With this configuration, direct currents flow through the first path in the first wire and through the second path in the second wire in different directions, using the first and second wires connected to electrodes with different polarities.

For example, low impedance circuit 11a may be placed in bypass path 43a connecting connection points (e.g., connection points N1a and N2a). One of the connection points (e.g., connection point N1a) is located on the first wire between one of the positive electrode and the negative electrode of DC power source 40 and magnetic core 21. The other one of the connection points (e.g., connection point N2a) is located on the second wire between magnetic core 21 and device 50.

With this configuration, the connection point on the first wire closer to DC power source 40 than magnetic core 21 and the connection point on the second wire closer to device 50 than magnetic core 21 are connected via low impedance circuit 11a by bypass path 43a. Accordingly, a high frequency component bypasses one of the first and second paths.

(Variation 1 of Embodiment 1)

In Embodiment 1, an example has been described where low impedance circuit 11a is placed in bypass path 43a connecting connection point N1a and connection point N2a. Connection point N1a is located on wire 41a between the positive electrode of DC power source 40 and magnetic core 21. Connection point N2a is located on wire 42a between magnetic core 21 and device 50. The configuration is not limited thereto. In Variation 1 of Embodiment 1, an example will be described where a low impedance circuit is placed in a bypass path connecting the following connection points. One of the connection points is located on a first wire between the negative electrode of DC power source 40 and magnetic core 21. The other of the connection points is located on a second wire between magnetic core 21 and device 50.

Figure 2A:
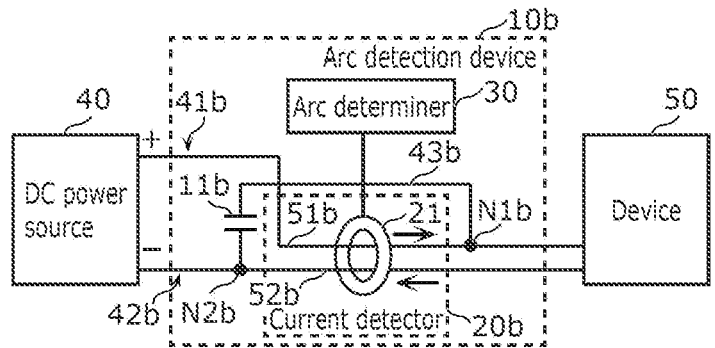
FIG. 2A is a configuration diagram showing an example arc detection device according to Variation 1 of Embodiment 1.

FIG. 2A is a configuration diagram showing example arc detection device 10b according to Variation 1 of Embodiment 1. Note that FIG. 2A also shows DC power source 40 and device 50.

DC power source 40 includes a positive electrode and a negative electrode. The positive electrode is connected to wire 41b, while the negative electrode is connected to wire 42b. Via wires 41b and 42b, DC power source 40 feeds the DC power to device 50.

Device 50 is fed with DC power from DC power source 40 via wires 41b and 42b.

Wires 41b and 42b connect DC power source 40 and device 50. Wire 42b is an example of the "first wire" connected to one of the positive and negative electrodes of DC power source 40. Here, wire 42b is connected to the negative electrode as the one of the positive and negative electrodes of DC power source 40. Wire 41b is an example of the "second wire" connected to the other of the positive and negative electrodes of DC power source 40. Here, wire 41b is connected to the positive electrode as the other of the positive and negative electrodes of DC power source 40.

Wires 41b and 42b penetrate magnetic core 21. A part (i.e., a path) of wire 41b penetrating magnetic core 21 is referred to as "path 51b", while a part (i.e., a path) of wire 42b penetrating magnetic core 21 is referred to as "path 52b". Passing through wire 41b connecting DC power source 40 and device 50, path 51b can also be regarded as connecting DC power source 40 and device 50. Path 51b is an example of the "second path" connecting DC power source 40 and device 50. Passing through wire 42b connecting DC power source 40 and device 50, path 52b can also be regarded as connecting DC power source 40 and device 50. Path 52b is an example of the "first path" connecting DC power source 40 and device 50.

In magnetic core 21, a direct current flows through path 51b in a direction opposite to the direction in which a direct current flows through path 52b. Path 51b passes through wire 41b connected to the positive electrode of DC power source 40, while path 52b passes through wire 42b connected to the negative electrode of DC power source 40. From the fact it is also clear that a direct current flows through path 51b in a direction opposite to the direction in which a direct current flows through path 52b. In FIG. 2A, the direction in which a direct current flows through path 51b and the direction in which a direct current flows through path 52b are indicated by arrows near magnetic core 21.

Arc detection device 10b is for detecting an arc and includes low impedance circuit 11b, current detector 20b, and arc determiner 30

Current detector 20b includes magnetic core 21 penetrated by paths 51b and 52b and detects currents flowing through paths 51b and 52b in accordance with the magnetic field generated in magnetic core 21.

Current detector 20b also includes, for example, a Hall element (not shown) that detects the magnetic field generated in magnetic core 21 and produces a voltage corresponding to the magnetic field generated in magnetic core 21. A voltage produced by the Hall element is, as a signal indicating the magnetic field generated in magnetic core 21, that is, a current flowing through each path penetrating magnetic core 21, input to arc determiner 30.

Low impedance circuit 11b has a lower impedance than impedances of DC power source 40 and device 50. Low impedance circuit 11b is connected to paths 51b and 52b so that a high frequency component bypasses one of paths 51b and 52b. Low impedance circuit 11b is, for example, a capacitor with a lower impedance than impedances of the capacitance components of DC power source 40 and device 50. Since the capacitor functions to block DC components, only a high frequency component can be extracted from a signal flowing through each of wires 41*b* and 42*b*. The capacitance value of the capacitor is determined as appropriate in accordance with the frequency or other characteristics of a high frequency component to be extracted. Since low impedance circuit 11*b* has a lower impedance than impedances of DC power source 40 and device 50, a high frequency component easily flows toward low impedance circuit 11*b* through wires 41*b* and 42*b*.

Specifically, low impedance circuit 11*b* is placed in bypass path 43*b* connecting connection points N2*b* and N1*b*. Connection point N2*b* is located on wire 42*b* between one of the positive and negative electrodes (e.g., the negative electrode here) of DC power source 40 and magnetic core 21. Connection point N1*b* is located on wire 41*b* between magnetic core 21 and device 50.

Arc determiner 30 determines the occurrence of an arc based on a current detected by current detector 20*b*. For example, arc determiner 30 performs frequency analysis of a current detected by current detector 20*b* to determine the occurrence of an arc in wire 41*b* or 42*b*.

Low impedance circuit (e.g., capacitor) 11*b* is an element that blocks direct currents and allows alternating currents (i.e., high frequency components) to pass. Low impedance circuit 11*b* allows a high frequency component contained in a current flowing through wire 41*b* or 42*b* to flow to bypass path 43*b*. The principle that arc detection device 10*b* achieves accurate detection of an arc by including such low impedance circuit 11*b* will be described with reference to FIGS. 2B and 2C.

Figure 2B:
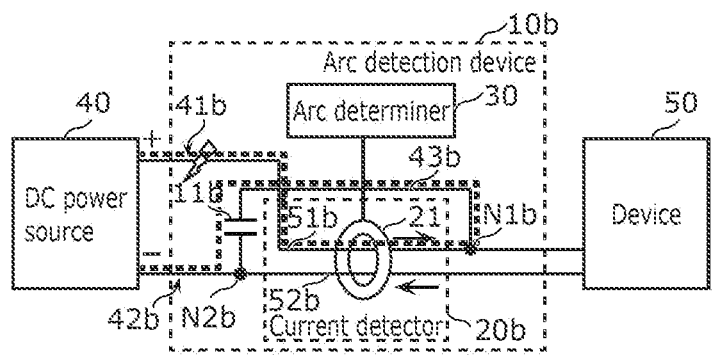
FIG. 2B shows example currents flowing through wires in the arc detection device according to Variation 1 of Embodiment 1 at the occurrence of an arc.
Figure 2C:
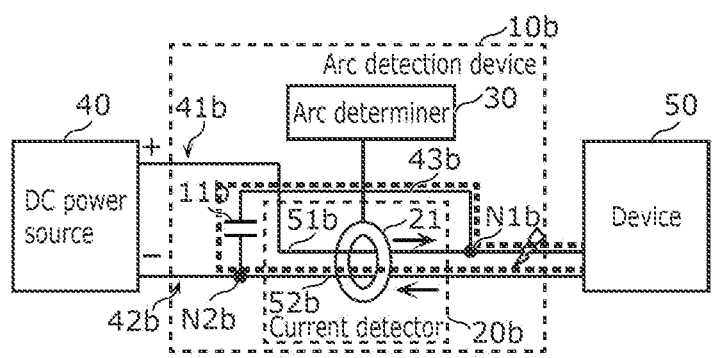
FIG. 2C shows example currents flowing through wires in the arc detection device according to Variation 1 of Embodiment 1 at the occurrence of an arc.

FIGS. 2B and 2C each shows example currents flowing through wires in arc detection device 10*b* according to Variation 1 of Embodiment 1 at the occurrence of an arc. FIG. 2B assumes that an arc occurs in wire 41*b* between the positive electrode of DC power source 40 and connection point N1*b*. FIG. 2C assumes that an arc occurs in wire 41*b* between device 50 and magnetic core 21. In FIGS. 2B and 2C, a bold broken line represents a flow of a high frequency component caused by the occurrence of the arc.

As described above, the magnetic field generated by a direct current flowing through path 51*b* and the magnetic field generated by a direct current flowing through path 52*b* in magnetic core 21 cancel each other to reduce magnetic saturation. In addition, these direct currents do not flow to bypass path 43*b* due to low impedance circuit (capacitor) 11*b* that blocks direct currents.

First, the principle of allowing accurate detection of an arc occurring on wire 41*b* between the positive electrode of DC power source 40 and connection point N1*b* as shown in FIG. 2B will be described.

A high frequency component generated by the arc flows through path 51*b* in magnetic core 21 and flows to bypass path 43*b* at connection point N1*b*. This is because the high frequency component attempts to flow not through a path connecting connection point N1*b* and device 50 but through bypass path 43*b* provided with low impedance circuit 11*b*. The high frequency component then flows through a path connecting connection point N2*b* and DC power source 40. In this manner, bypass path 43*b* serves as a path that bypasses path 52*b* so that the high frequency component flows through path 51*b* but not through path 52*b* in magnetic core 21. Accordingly, in magnetic core 21, the magnetic field corresponding to a direct current flowing through path 51*b* and the magnetic field corresponding to a direct current flowing through path 52*b* cancel each other. As a result, the magnetic field corresponding to the high frequency component flowing through path 51*b* is generated. The magnetic field is output as a voltage signal to arc determiner 30 by a Hall element, for example. Based on the voltage signal, arc determiner 30 determines the occurrence of the arc.

Next, the principle of allowing accurate detection of an arc occurring on wire 41*b* between device 50 and connection point N1*b* as shown in FIG. 2C will be described.

A high frequency component generated by the arc flows to bypass path 43*b* at connection point N1*b*. This is because the high frequency component attempts to flow not through path 51*b* connecting connection point N1*b* and DC power source 40 but through bypass path 43*b* provided with low impedance circuit 11*b*. The high frequency component then flows through path 52*b* connecting connection point N2*b* and device 50. In this manner, bypass path 43*b* serves as a path that bypasses path 51*b* so that the high frequency component flows through path 52*b* but not through path 51*b* in magnetic core 21. Accordingly, in magnetic core 21, the magnetic field corresponding to a direct current flowing through path 51*b* and the magnetic field corresponding to a direct current flowing through path 52*b* cancel each other. As a result, the magnetic field corresponding to the high frequency component flowing through path 52*b* is generated. The magnetic field is output as a voltage signal to arc determiner 30 by a Hall element, for example. Based on the voltage signal, arc determiner 30 determines the occurrence of the arc.

In this manner, even low impedance circuit 11*b* placed in bypass path 43*b* connecting the following connection point N2*b* and connection point N1*b* detects an arc accurately. Connection point N2*b* is located on wire 42*b* between the negative electrode of DC power source 40 and magnetic core 21. Connection point N1*b* is located on wire 41*b* between magnetic core 21 and device 50.

(Variation 2 of Embodiment 1)

In Embodiment 1, an example has been described where paths 51*a* and 52*a* are as follows. Path 51*a* penetrating magnetic core 21 passes through wire 41*a* connected to one of the positive and negative electrodes (e.g., the positive electrode) of DC power source 40. Path 52*a* penetrating magnetic core 21 passes through wire 42*a* connected to the other of the positive and negative electrodes (e.g., the negative electrode) of DC power source 40. The configuration is not limited thereto. In Variation 2 of Embodiment 1, an example will be described where two paths penetrating magnetic core 21 pass through a first wire connected to one of the positive and negative electrodes of DC power source 40.

Figure 3A:
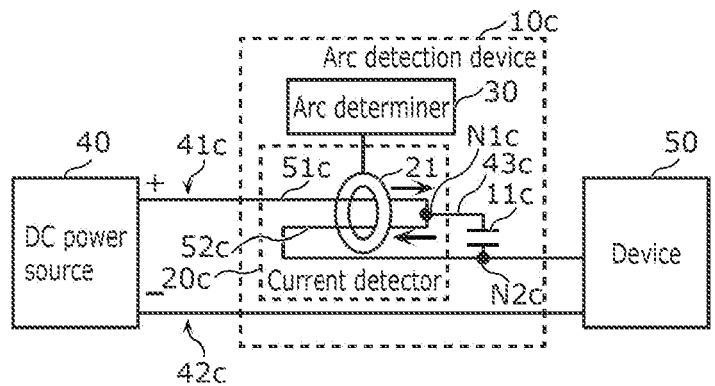
FIG. 3A is a configuration diagram showing an example arc detection device according to Variation 2 of Embodiment 1.

FIG. 3A is a configuration diagram showing example arc detection device 10*c* according to Variation 2 of Embodiment 1. Note that FIG. 3A also shows DC power source 40 and device 50.

DC power source 40 includes a positive electrode and a negative electrode. The positive electrode is connected to wire 41*c*, while the negative electrode is connected to wire 42*c*. Via wires 41*c* and 42*c*, DC power source 40 feeds the DC power to device 50.

Device 50 is fed with DC power from DC power source 40 via wires 41*c* and 42*c*.

Wires 41*c* and 42*c* connect DC power source 40 and device 50. Wire 41*c* is an example of the "first wire" connected to one of the positive and negative electrodes of DC power source 40. Here, wire 41*c* is connected to the positive electrode as the one of the positive and negative electrodes of DC power source 40. Wire 42*c* is an example of the "second wire" connected to the other of the positive and negative electrodes of DC power source 40. Here, wire 42c is connected to the negative electrode as the other of the positive and negative electrodes of DC power source 40.

Wire 41c penetrates magnetic core 21. Specifically, wire 41c penetrates magnetic core 21 from one side (e.g., the left of magnetic core 21 in FIG. 3A) to the other side (the right of magnetic core 21 in FIG. 3A) of magnetic core 21 and then turns around to penetrate magnetic core 21 from the other side to the one side of magnetic core 21. A part (i.e., a path) of wire 41c penetrating magnetic core 21 from the one side to the other side is referred to "path 51c", while a part (i.e., a path) of wire 41c penetrating magnetic core 21 from the other side to the one side is referred to "path 52c". Passing through wire 41c connecting DC power source 40 and device 50, paths 51c and 52c can also be regarded as connecting DC power source 40 and device 50. Path 51c is an example of the "first path" connecting DC power source 40 and device 50, while path 52c is an example of the "second path" connecting DC power source 40 and device 50.

In magnetic core 21, a direct current flows through path 51c in a direction opposite to the direction in which a direct current flows through path 52c. Both paths 51c and 52c pass through wire 41c. Path 51c penetrates magnetic core 21 from the one side to the other side, while path 52c penetrates magnetic core 21 from the other side to the one side. From the fact, it is also clear that a direct current flows through path 51c in a direction opposite to a direct current flows through path 52c in magnetic core 21. In FIG. 3A, the direction in which a direct current flows through path 51c and the direction in which a direct current flows through path 52c are indicated by arrows near magnetic core 21.

Arc detection device 10c is for detecting an arc and includes low impedance circuit 11c, current detector 20c, and arc determiner 30

Current detector 20c includes magnetic core 21 penetrated by paths 51c and 52c and detects a current flowing through paths 51c and 52c in accordance with the magnetic field generated in magnetic core 21.

Current detector 20c includes, for example, a Hall element (not shown) that detects the magnetic field generated in magnetic core 21 and produces a voltage corresponding to the magnetic field generated in magnetic core 21. A voltage produced by the Hall element is, as a signal indicating the magnetic field generated in magnetic core 21, that is, a current flowing through the paths penetrating magnetic core 21, input to arc determiner 30.

Low impedance circuit 11c has a lower impedance than impedances of DC power source 40 and device 50. Low impedance circuit 11c is connected to paths 51c and 52c so that a high frequency component bypasses one of paths 51c and 52c. Low impedance circuit 11c is, for example, a capacitor with a lower impedance than impedances of the capacitance components of DC power source 40 and device 50. Since the capacitor functions to block DC components, only a high frequency component can be extracted from a signal flowing through wire 41c. The capacitance value of the capacitor is determined as appropriate in accordance with the frequency or other characteristics of a high frequency component to be extracted. Since low impedance circuit 11c has a lower impedance than impedances of DC power source 40 and device 50, a high frequency component easily flows toward low impedance circuit 11c through wire 41c.

Specifically, low impedance circuit 11c is placed in bypass path 43c connecting connection point N1c in the turnaround and connection point N2c on wire 41c between the one side of magnetic core 21 and device 50.

Arc determiner 30 determines the occurrence of an arc based on a current detected by current detector 20c. For example, arc determiner 30 performs frequency analysis of a current detected by current detector 20c to determine the occurrence of an arc in wire 41c or 42c.

Low impedance circuit (e.g., capacitor) 11c is an element that blocks direct currents and allows alternating currents (i.e., high frequency components) to pass. Low impedance circuit 11c allows a high frequency component contained in a current flowing through wire 41c to bypass path 43c. The principle that arc detection device 10c achieves accurate detection of an arc by including such low impedance circuit 11c will be described with reference to FIGS. 3B and 3C.

Figure 3B:
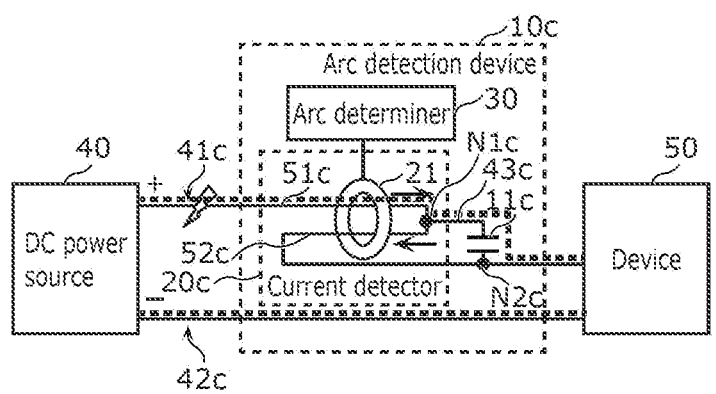
FIG. 3B shows example currents flowing through wires in the arc detection device according to Variation 2 of Embodiment 1 at the occurrence of an arc.
Figure 3C:
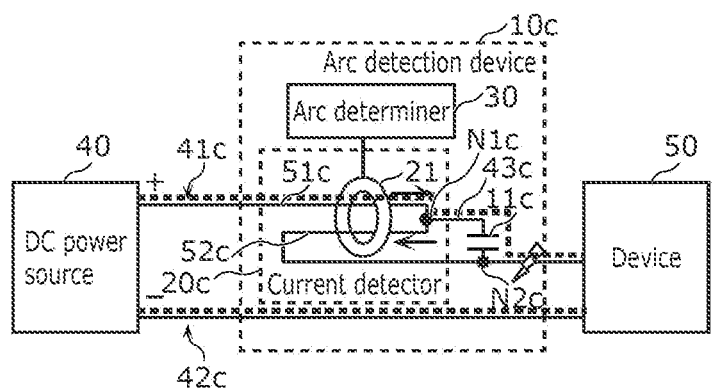
FIG. 3C shows example currents flowing through wires in the arc detection device according to Variation 2 of Embodiment 1 at the occurrence of an arc.

FIGS. 3B and 3C each shows example currents flowing through wires in arc detection device 10c according to Variation 2 of Embodiment 1 at the occurrence of an arc. FIG. 3B assumes that an arc occurs in wire 41c between the positive electrode of DC power source 40 and the one side of magnetic core 21. FIG. 3C assumes that an arc occurs in wire 41c between device 50 and connection point N2c. In FIGS. 3B and 3C, a bold broken line represents a flow of a high frequency component caused by the occurrence of the arc.

As described above, the magnetic field generated by a direct current flowing through path 51c and the magnetic field generated by a direct current flowing through path 52c in magnetic core 21 cancel each other to reduce magnetic saturation. In addition, these direct currents do not flow to bypass path 43c due to low impedance circuit (capacitor) 11c that blocks direct currents.

First, the principle of allowing accurate detection of an arc occurring on wire 41c between the positive electrode of DC power source 40 and the one side of magnetic core 21 as shown in FIG. 3B will be described.

A high frequency component generated by the arc flows through path 51c in magnetic core 21 and flows to bypass path 43c at connection point N1c. This is because the high frequency component attempts to flow not through path 52c but through bypass path 43c provided with low impedance circuit 11c. The high frequency component then flows through a path connecting connection point N2c and device 50. In this manner, bypass path 43c serves as a path that bypasses path 51c so that the high frequency component flows through path 51c but not through path 52c in magnetic core 21. Accordingly, in magnetic core 21, the magnetic field corresponding to a direct current flowing through path 51c and the magnetic field corresponding to a direct current flowing through path 52c cancel each other. As a result, the magnetic field corresponding to the high frequency component flowing through path 51c is generated. The magnetic field is output as a voltage signal to arc determiner 30 by a Hall element, for example. Based on the voltage signal, arc determiner 30 determines the occurrence of the arc.

Next, the principle of allowing accurate detection of an arc occurring on wire 41c between device 50 and connection point N2c as shown in FIG. 3C will be described.

A high frequency component generated by the arc flows to bypass path 43c at connection point N2c. This is because the high frequency component attempts to flow not through path 52c but through bypass path 43c provided with low impedance circuit 11c. The high frequency component then flows through path 51c connecting connection point N1c and DC power source 40. In this manner, bypass path 43c servers a path that bypasses path 52c so that the high frequency component flows through path 51c but not through path 52c in magnetic core 21. Accordingly, in magnetic core 21, the magnetic field corresponding to a direct current flowing through path 51c and the magnetic field corresponding to a direct current flowing through path 52c cancel each other. As a result, the magnetic field corresponding to the high frequency component flowing through path 51c is generated. The magnetic field is output as a voltage signal to arc determiner 30 by a Hall element, for example. Based on the voltage signal, arc determiner 30 determines the occurrence of the arc.

As described above, DC power source 40 feeds electric power to device 50 via a first wire (e.g., wire 41c) connected to one of a positive electrode and a negative electrode of DC power source 40 and a second wire (e.g., wire 42c) connected to the other of the positive electrode and the negative electrode of DC power source 40. The first path (e.g., path 51c) and the second path (e.g., path 52c) pass through the first wire. The first wire penetrates magnetic core 21 from one side to the other side of magnetic core 21 in the first path and then turns around, and penetrates magnetic core 21 from the other side to the one side of magnetic core 21 in the second path.

With this configuration, the first wire penetrates magnetic core 21 once and turns around to penetrate magnetic core 21 again. Accordingly, a direct current flows through the first wire in a direction opposite to the direction in which a direct current flows through the second path in the first path.

For example, low impedance circuit 11c may be placed in bypass path 43c connecting a connection point (e.g., connection point N1c) in the turnaround and a connection point (e.g., connection point N2c) on the first wire between the one side of magnetic core 21 and device 50.

With this configuration, bypass path 43c connects the following connection points via low impedance circuit 11c. One of the connection points is located in the turnaround of the first wire after penetrating magnetic core 21 once as viewed from DC power source 40. The other of the connection points is located on the first wire after penetrating magnetic core 21 again. Accordingly, a high frequency component bypasses the second path.

(Variation 3 of Embodiment 1)

In Variation 2 of Embodiment 1, an example has been described where low impedance circuit 11c is placed in bypass path 43c connecting connection point N1c and connection point N2c. Connection point N1c is located in a turnaround of wire 41c.

Connection point N2c is located on wire 41c between one side of magnetic core 21 and device 50. The configuration is not limited thereto. In Variation 3 of Embodiment 1, an example will be described where a low impedance circuit is placed in a bypass path connecting the following connection points. One of the connection points is located in a turnaround of a first wire connected to one of the positive and negative electrodes of DC power source 40. The other of the connection points is located on a first wire between one side of magnetic core 21 and one of the positive and negative electrodes of DC power source 40.

Figure 4A:
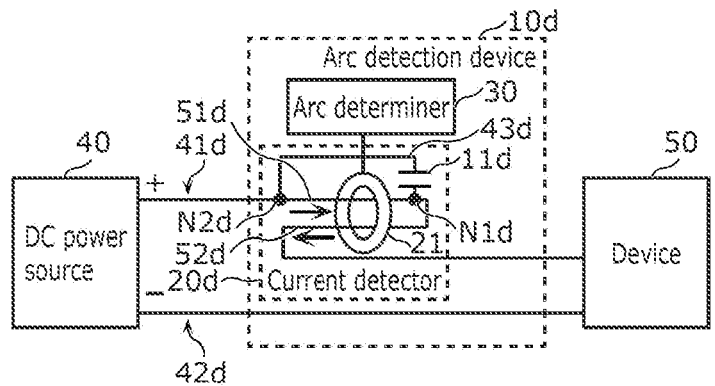
FIG. 4A is a configuration diagram showing an example arc detection device according to Variation 3 of Embodiment 1.

FIG. 4A is a configuration diagram showing example arc detection device 10d according to Variation 3 of Embodiment 1. Note that FIG. 4A also shows DC power source 40 and device 50.

DC power source 40 includes a positive electrode and a negative electrode. The positive electrode is connected to wire 41d, while the negative electrode is connected to wire 42d. Via wires 41d and 42d, DC power source 40 feeds the DC power to device 50.

Device 50 is fed with DC power from DC power source 40 via wires 41d and 42d.

Wires 41d and 42d connect DC power source 40 and device 50. Wire 41d is an example of the "first wire" connected to one of the positive and negative electrodes of DC power source 40. Here, wire 41d is connected to the positive electrode as the one of the positive and negative electrodes of DC power source 40. Wire 42d is an example of the "second wire" connected to the other of the positive and negative electrodes of DC power source 40. Here, wire 42d is connected to the negative electrode as the other of the positive and negative electrodes of DC power source 40.

Wire 41d penetrates magnetic core 21. Specifically, wire 41d penetrates magnetic core 21 from one side (e.g., the left of magnetic core 21 in FIG. 4A) to the other side (e.g., the right of magnetic core 21 in FIG. 4A) of magnetic core 21 and then turns around to penetrate magnetic core 21 from the other side to the one side of magnetic core 21. A part (i.e., a path) of wire 41d penetrating magnetic core 21 from the one side to the other side is referred to "path 51d", while a part (i.e., a path) of wire 41d penetrating magnetic core 21 from the other side to the one side is referred to "path 52d". Passing through wire 41d connecting DC power source 40 and device 50, paths 51d and 52d can also be regarded as connecting DC power source 40 and device 50. Path 51d is an example of the "first path" connecting DC power source 40 and device 50, while path 52d is an example of the "second path" connecting DC power source 40 and device 50.

In magnetic core 21, a direct current flows through path 51d in a direction opposite to the direction in which a direct current flows through path 52d. Both paths 51d and 52d pass through wire 41d. Path 51d penetrates magnetic core 21 from the one side to the other side, while path 52d penetrates magnetic core 21 from the other side to the one side. From the fact, it is also clear that a direct current flows through path 51d in a direction opposite to the direction in which a direct current flows through path 52d in magnetic core 21. In FIG. 4A, the direction in which a direct current flows through path 51d and the direction in which a direct current flows through path 52d are indicated by arrows near magnetic core 21.

Arc detection device 10d is for detecting an arc and includes low impedance circuit 11d, current detector 20d, and arc determiner 30.

Current detector 20d includes magnetic core 21 penetrated by paths 51d and 52d and a detects current flowing through paths 51d and 52d in accordance with the magnetic field generated in magnetic core 21.

Current detector 20d includes, for example, a Hall element (not shown) that detects the magnetic field generated in magnetic core 21 and produces a voltage corresponding to the magnetic field generated in magnetic core 21. A voltage produced by the Hall element is, as a signal indicating the magnetic field generated in magnetic core 21, that is, a current flowing through the paths penetrating magnetic core 21, input to arc determiner 30.

Low impedance circuit 11d has a lower impedance than impedances of DC power source 40 and device 50. Low impedance circuit 11d is connected to paths 51d and 52d so that a high frequency component bypasses one of paths 51d and 52d. Low impedance circuit 11d is, for example, a capacitor with a lower impedance than impedances of the capacitance components of DC power source 40 and device 50. Since the capacitor functions to block DC components, only a high frequency component can be extracted from a signal flowing through wire 41d. The capacitance value of the capacitor is determined as appropriate in accordance with the frequency or other characteristics of a high frequency component to be extracted. Since low impedance circuit 11d has a lower impedance than impedances of DC power source 40 and device 50, a high frequency component easily flows toward low impedance circuit 11d through wire 41d.

Specifically, low impedance circuit 11d is placed in bypass path 43d connecting connection point N1d and connection point N2d. Connection point N1d is located in the turnaround. Connection point N2d is located on wire 41d between the one side of magnetic core 21 and one of the positive and negative electrodes (e.g., the positive electrode) of DC power source 40.

Arc determiner 30 determines the occurrence of an arc based on a current detected by current detector 20d. For example, arc determiner 30 performs frequency analysis of a current detected by current detector 20d to determine the occurrence of an arc in wire 41d or 42d.

Low impedance circuit (e.g., capacitor) 11d is an element that blocks direct currents and allows alternating currents (i.e., high frequency components) to pass. Low impedance circuit 11d allows a high frequency component contained in a current flowing through wire 41d to bypass path 43d. The principle that arc detection device 10d achieves accurate detection of an arc by including such low impedance circuit 11d will be described with reference to FIGS. 4B and 4C.

Figure 4B:
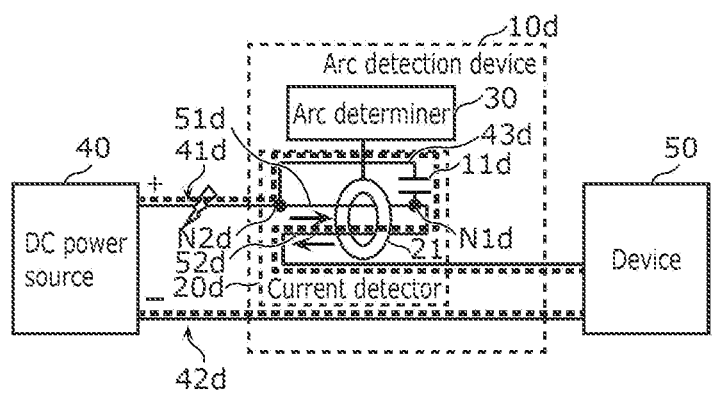
FIG. 4B shows example currents flowing through wires in the arc detection device according to Variation 3 of Embodiment 1 at the occurrence of an arc.
Figure 4C:
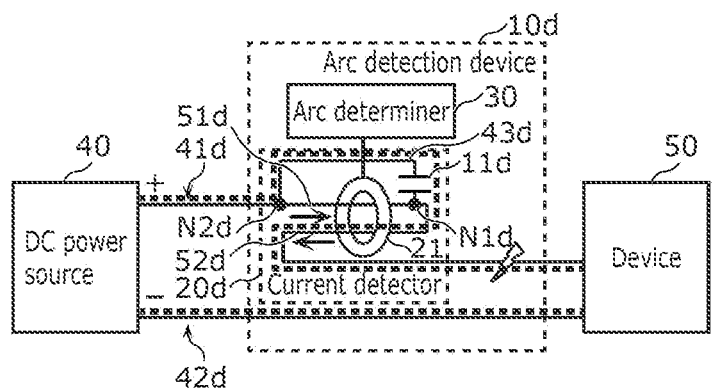
FIG. 4C shows example currents flowing through wires in the arc detection device according to Variation 3 of Embodiment 1 at the occurrence of an arc.

FIGS. 4B and 4C each shows example currents flowing through wires in arc detection device 10d according to Variation 3 of Embodiment 1 at the occurrence of an arc. FIG. 4B assumes that an arc occurs in wire 41d between the positive electrode of DC power source 40 and connection point N2d. FIG. 4C assumes that an arc occurs in wire 41d between device 50 and the one side of magnetic core 21. In FIGS. 4B and 4C, a bold broken line represents a flow of a high frequency component caused by the occurrence of the arc.

As described above, the magnetic field generated by a direct current flowing through path 51d and the magnetic field generated by a direct current flowing through path 52d in magnetic core 21 cancel each other to reduce magnetic saturation. In addition, these direct currents do not flow to bypass path 43d due to low impedance circuit (capacitor) 11d that blocks direct currents.

First, the principle of allowing accurate detection of an arc occurring on wire 41d between the positive electrode of DC power source 40 and connection point N2d as shown in FIG. 4B will be described.

A high frequency component generated by the arc flows to bypass path 43d at connection point N2d. This is because the high frequency component attempts to flow not through path 51d but through bypass path 43d provided with low impedance circuit 11d. The high frequency component then flows through path 52d connecting connection point N1d and device 50. In this manner, bypass path 43d serves as a path that bypasses path 51d so that the high frequency component flows through path 52d but not through path 51d in magnetic core 21. Accordingly, in magnetic core 21, the magnetic field corresponding to a direct current flowing through path 51d and the magnetic field corresponding to a direct current flowing through path 52d cancel each other. As a result, the magnetic field corresponding to the high frequency component flowing through path 52d is generated. The magnetic field is output as a voltage signal to arc determiner 30 by a Hall element, for example. Based on the voltage signal, arc determiner 30 determines the occurrence of the arc.

Next, the principle of allowing accurate detection of an arc occurring on wire 41d between device 50 and the one side of magnetic core 21 as shown in FIG. 4C will be described.

A high frequency component generated by the arc flows through path 52d in magnetic core 21 and flows to bypass path 43d at connection point N1d. This is because the high frequency component attempts to flow not through path 51d but through bypass path 43d provided with low impedance circuit 11d. The high frequency component then flows through a path connecting connection point N2d and DC power source 40. In this manner, bypass path 43d serves as a path that bypasses path 51d so that the high frequency component flows through path 52d but not through path 51d in magnetic core 21. Accordingly, in magnetic core 21, the magnetic field corresponding to a direct current flowing through path 51d and the magnetic field corresponding to a direct current flowing through path 52d cancel each other. As a result, the magnetic field corresponding to the high frequency component flowing through path 52d is generated. The magnetic field is output as a voltage signal to arc determiner 30 by a Hall element, for example. Based on the voltage signal, arc determiner 30 determines the occurrence of the arc.

As described above, low impedance circuit 11d may be placed in bypass path 43d connecting a connection point (e.g., connection point N1d) in the turnaround of the first wire (e.g., wire 41d) and a connection point on the first wire (e.g., connection point N2d) between one side of magnetic core 21 and one of the positive and negative electrodes of DC power source 40.

With this configuration, bypass path 43d connects the following connection points via low impedance circuit 11d. One of the connection points is located in the turnaround of the first wire after penetrating magnetic core 21 once as viewed from DC power source 40. The other of the connection points is located on the first wire before penetrating magnetic core 21. Accordingly, a high frequency component bypasses the first path.

(Variation 4 of Embodiment 1)

In Variations 2 and 3 of Embodiment 1, an example has been described where each low impedance circuit is placed in the bypass path connecting the following connection points. One of the connection points is located in a turnaround of the first wire. The other of the connection points is located on the first wire between one side of magnetic core 21 and DC power source 40 or device 50. The configuration is not limited thereto. In Variation 4 of Embodiment 1, an example will be described where a low impedance circuit is placed in a bypass path connecting the following connection points. One of the connection points is located in a turnaround of a first wire connected to one of the positive and negative electrodes of DC power source 40. The other of the connection points is located on a second wire.

Figure 5A:
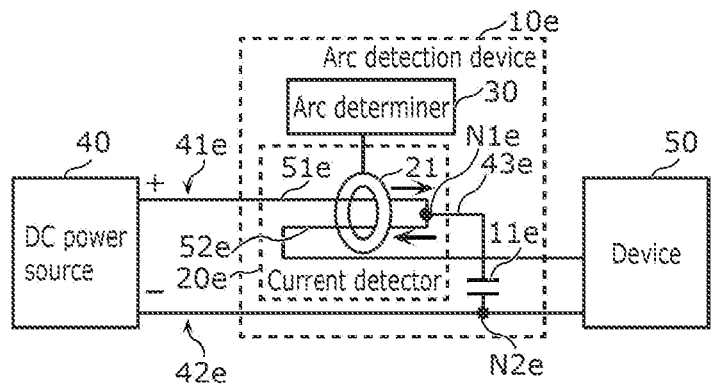
FIG. 5A is a configuration diagram showing an example arc detection device according to Variation 4 of Embodiment 1.

FIG. 5A is a configuration diagram showing example arc detection device 10e according to Variation 4 of Embodiment 1. Note that FIG. 5A also shows DC power source 40 and device 50.

DC power source 40 includes a positive electrode and a negative electrode. The positive electrode is connected to wire 41e, while the negative electrode is connected to wire 42e. Via wires 41e and 42e, DC power source 40 feeds the DC power to device 50.

Device 50 is fed with DC power from DC power source 40 via wires 41e and 42e.

Wires 41e and 42e connect DC power source 40 and device 50. Wire 41e is an example of the "first wire"

connected to one of the positive and negative electrodes of DC power source 40. Here, wire 41e is connected to the positive electrode as the one of the positive and negative electrodes of DC power source 40. Wire 41e is an example of the "second wire" connected to the other of the positive and negative electrodes of DC power source 40. Here, wire 41e is connected to the negative electrode as the other of the positive and negative electrodes of DC power source 40.

Wire 41e penetrates magnetic core 21. Specifically, wire 41e penetrates magnetic core 21 from one side (e.g., the left of magnetic core 21 in FIG. 5A) to the other side (e.g., the right of magnetic core 21 in FIG. 5A) of magnetic core 21 and then turns around to penetrate magnetic core 21 from the other side to the one side of magnetic core 21. A part (i.e., a path) of wire 41e penetrating magnetic core 21 from the one side to the other side is referred to "path 51e", while a part (i.e., a path) of wire 41e penetrating magnetic core 21 from the other side to the one side is referred to "path 52e". Passing through wire 41e connecting DC power source 40 and device 50, paths 51e and 52e can also be regarded as connecting DC power source 40 and device 50. Path 51e is an example of the "first path" connecting DC power source 40 and device 50, while path 52e is an example of the "second path" connecting DC power source 40 and device 50.

In magnetic core 21, a direct current flows through path 51e in a direction opposite to the direction in which a direct current flows through path 52e. Both paths 51e and 52e pass through wire 41e. Path 51e penetrates magnetic core 21 from the one side to the other side, while path 52e penetrates magnetic core 21 from the other side to the one side. From the fact, it is also clear that a direct current flows through path 51e in a direction opposite to the direction in which a direct current flows through path 52e in magnetic core 21. In FIG. 5A, the direction in which a direct current flows through path 51e and the direction in which a direct current flows through path 52e are indicated by arrows near magnetic core 21.

Arc detection device 10e is for detecting an arc and includes low impedance circuit 11e, current detector 20e, and arc determiner 30

Current detector 20e includes magnetic core 21 penetrated by paths 51e and 52e and detects a current flowing through paths 51e and 52e in accordance with the magnetic field generated in magnetic core 21.

Current detector 20e includes, for example, a Hall element (not shown) that detects the magnetic field generated in magnetic core 21 and produces a voltage corresponding to the magnetic field generated in magnetic core 21. A voltage produced by the Hall element is, as a signal indicating the magnetic field generated in magnetic core 21, that is, a current flowing through the paths penetrating magnetic core 21, input to arc determiner 30.

Low impedance circuit 11e has a lower impedance than impedances of DC power source 40 and device 50. Low impedance circuit 11e is connected to paths 51e and 52e so that a high frequency component bypasses one of paths 51e and 52e. Low impedance circuit 11e is, for example, a capacitor with a lower impedance than impedances of the capacitance components of DC power source 40 and device 50. Since the capacitor functions to block DC components, only a high frequency component can be extracted from a signal flowing through each of wires 41e and 42e. The capacitance value of the capacitor is determined as appropriate in accordance with the frequency or other characteristics of a high frequency component to be extracted. Since low impedance circuit 11e has a lower impedance than impedances of DC power source 40 and device 50, a high frequency component easily flows toward low impedance circuit 11e through wires 41e and 42e.

Specifically, low impedance circuit 11e is placed in bypass path 43e connecting connection point N1e in the turnaround and connection point N2e on wire 42e.

Arc determiner 30 determines the occurrence of an arc based on a current detected by current detector 20e. For example, arc determiner 30 performs frequency analysis of a current detected by current detector 20e to determine the occurrence of an arc in wire 41e or 42e.

Low impedance circuit (e.g., capacitor) 11e is an element that blocks direct currents and allows alternating currents (i.e., high frequency components) to pass. Low impedance circuit 11e allows a high frequency component contained in a current flowing through wires 41e and 42e to bypass path 43e. The principle that arc detection device 10e achieves accurate detection of an arc by including such low impedance circuit 11e will be described with reference to FIGS. 5B and 5C.

Figure 5B:
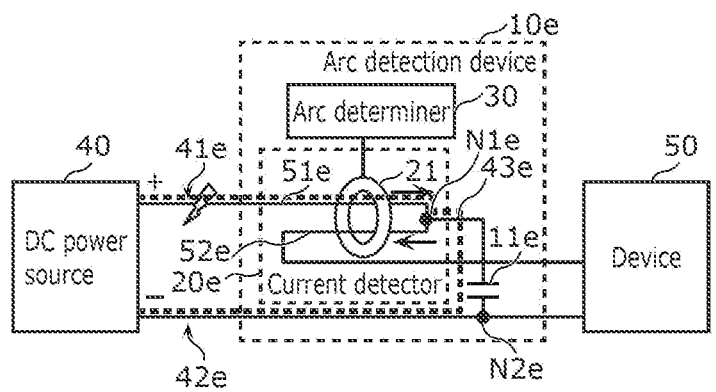
FIG. 5B shows example currents flowing through wires in the arc detection device according to Variation 4 of Embodiment 1 at the occurrence of an arc.
Figure 5C:
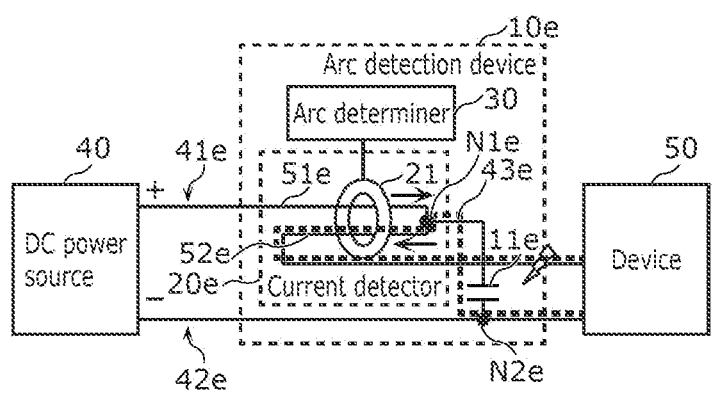
FIG. 5C shows example currents flowing through wires in the arc detection device according to Variation 4 of Embodiment 1 at the occurrence of an arc.

FIGS. 5B and 5C each shows example currents flowing through wires in arc detection device 10e according to Variation 4 of Embodiment 1 at the occurrence of an arc. FIG. 5B assumes that an arc occurs in wire 41e between the positive electrode of DC power source 40 and the one side of magnetic core 21. FIG. 5C assumes that an arc occurs in wire 41e between device 50 and the one side of magnetic core 21. In FIGS. 5B and 5C, a bold broken line represents a flow of a high frequency component caused by the occurrence of the arc.

As described above, the magnetic field generated by a direct current flowing through path 51e and the magnetic field generated by a direct current flowing through path 52e in magnetic core 21 cancel each other to reduce magnetic saturation. In addition, these direct currents do not flow to bypass path 43e due to low impedance circuit (capacitor) 11e that blocks direct currents.

First, the principle of allowing accurate detection of an arc occurring on wire 42e between the positive electrode of DC power source 40 and the one side of magnetic core 21 as shown in FIG. 5B will be described.

A high frequency component generated by the arc flows through path 51e in magnetic core 21 and flows to bypass path 43e at connection point N1e. This is because the high frequency component attempts to flow not through path 52e but through bypass path 43e provided with low impedance circuit 11e. The high frequency component then flows through wire 42e connecting connection point N2e and DC power source 40. In this manner, bypass path 43e serves as a path that bypasses path 52e so that the high frequency component flows through path 51e but not through path 52e in magnetic core 21. Accordingly, in magnetic core 21, the magnetic field corresponding to a direct current flowing through path 51e and the magnetic field corresponding to a direct current flowing through path 52e cancel each other. As a result, the magnetic field corresponding to the high frequency component flowing through path 51e is generated. The magnetic field is output as a voltage signal to arc determiner 30 by a Hall element, for example. Based on the voltage signal, arc determiner 30 determines the occurrence of the arc.

Next, the principle of allowing accurate detection of an arc occurring on wire 41e between device 50 and the one side of magnetic core 21 as shown in FIG. 5C will be described.

A high frequency component generated by the arc flows through path 52e in magnetic core 21 and flows to bypass path 43e at connection point N1e. This is because the high frequency component attempts to flow not through path 51e but through bypass path 43e provided with low impedance circuit 11e. The high frequency component then flows through a path connecting connection point N2e and device 50. In this manner, bypass path 43e serves as a path that bypasses path 51e so that the high frequency component flows through path 52e but not through path 51e in magnetic core 21. Accordingly, in magnetic core 21, the magnetic field corresponding to a direct current flowing through path 51e and the magnetic field corresponding to a direct current flowing through path 52e cancel each other. As a result, the magnetic field corresponding to the high frequency component flowing through path 52e is generated. The magnetic field is output as a voltage signal to arc determiner 30 by a Hall element, for example. Based on the voltage signal, arc determiner 30 determines the occurrence of the arc.

As described above, low impedance circuit 11e may be placed in bypass path 43e connecting connection point (e.g., connection point N1e) in the turnaround of the first wire (e.g., wire 41e) and connection point (e.g., connection point N2e) on the second wire (e.g., wire 42e).

With this configuration, bypass path 43e connects the connection point in the turnaround of the first wire after penetrating magnetic core 21 once as viewed from DC power source 40 and the connection point on the second wire via low impedance circuit 11e. Accordingly, a high frequency component bypasses one of the first and second paths.

Embodiment 2

The arc detection device according to the present invention may be included in a solar inverter of a solar power system or any other suitable system. This will be described with reference to FIG. 6A.

Figure 6A:
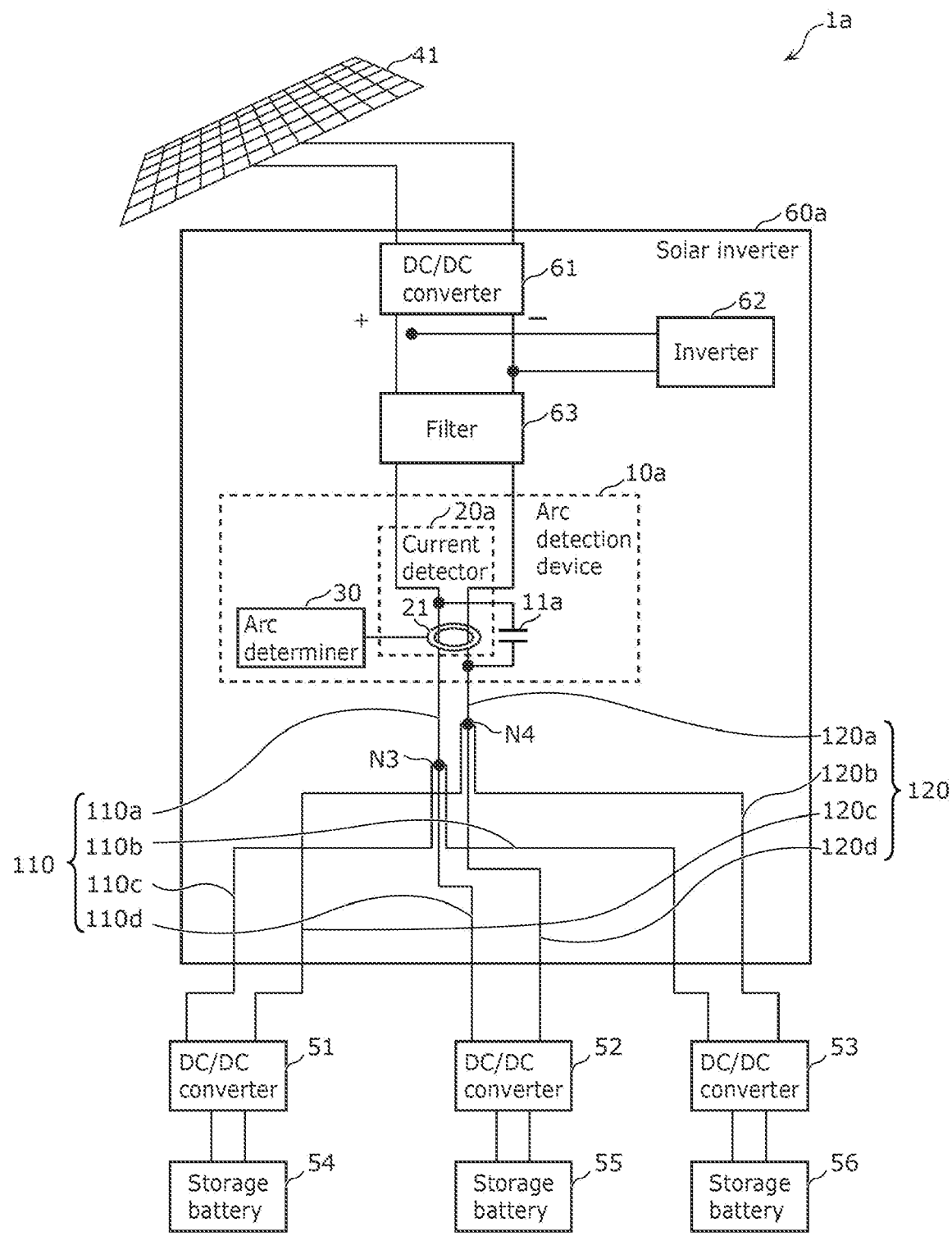
FIG. 6A is a configuration diagram showing an example solar power system according to Embodiment 2.

FIG. 6A is a configuration diagram showing example solar power system 1a according to Embodiment 2.

Solar power system 1a includes solar panel 41, storage batteries 54, 55, and 56, DC/DC converters 51, 52, and 53 as well as solar inverter 60a.

Solar panel 41 generates electricity, that is, DC power from sunlight. The DC power generated by solar panel 41 is fed to solar inverter 60a.

Storage battery 54 is charged with the DC power from DC/DC converter 51, storage battery 55 is charged with the DC power from DC/DC converter 52, and storage battery 56 is charged with the DC power from DC/DC converter 53. For example, storage batteries 54, 55, and 56 may be mounted on an electric vehicle or an electric bicycle, or may be used for feeding electric power to household or other electronic devices.

DC/DC converters 51, 52, and 53 are each a voltage converter that raises or lowers the DC voltage of the fed DC power and outputs the resultant DC power. DC/DC converter 51 raises or lowers the voltage of the DC power fed from solar inverter 60a and outputs the resultant DC power to storage battery 54. DC/DC converter 52 raises or lowers the voltage of the DC power fed from solar inverter 60a and outputs the resultant DC power to storage battery 55. DC/DC converter 53 raises or lowers the voltage of the DC power fed from solar inverter 60a and outputs the resultant DC power to storage battery 56.

Solar inverter 60a functions to convert the DC power fed from solar panel 41 into AC power. Solar inverter 60a also functions to feed the DC power fed from solar panel 41 to a storage battery or other components without converting the DC power into AC power. Solar inverter 60a includes DC/DC converter 61, inverter 62, and arc detection device 10a.

DC/DC converter 61 raises or lowers the voltage of the DC power fed from solar panel 41 and outputs the resultant DC power to DC/DC converters 51, 52, and 53 as well as inverter 62. Outputting the DC power, DC/DC converter 61 can be regarded as a DC power source. That is, DC/DC converter 61 is an example of the "DC power source". DC/DC converter 61 includes a positive electrode and a negative electrode. The positive electrode is connected to wire 110, while the negative electrode is connected to wire 120.

Wires 110 and 120 connect DC/DC converter 61 and DC/DC converters 51, 52, and 53. DC/DC converters 51, 52, and 53 are each an example of the "device" connected to DC/DC converter 61 via wires 110 and 120. Wire 110 is an example of the "first wire" connected to one of the positive and negative electrodes of DC/DC converter 61. Here, wire 110 is connected to the positive electrode as the one of the positive and negative electrodes of DC/DC converter 61. Wire 120 is an example of the "second wire" connected to the other of the positive and negative electrodes of DC/DC converter 61. Here, wire 120 is connected to the negative electrode as the other of the positive and negative electrodes of DC/DC converter 61.

Wire 110 branches from the positive electrode of DC/DC converter 61 into DC/DC converters 51, 52, and 53. The point at which wire 110 branches from the positive electrode of DC/DC converter 61 into DC/DC converters 51, 52, and 53 is referred to as "branch point N3".

Wire 110 includes the following paths. The path before branching, which connects branch point N3 and the positive electrode of DC/DC converter 61, is referred to as "path 110a". One of the paths after branching, which connects branch point N3 and DC/DC converter 51, is referred to as "path 110c". One of the paths after branching, which connects branch point N3 and DC/DC converter 52, is referred to as "path 110d". One of the paths after branching, which connects branch point N3 and DC/DC converter 53 is referred to as "path 110b".

Wire 120 branches from the negative electrode of DC/DC converter 61 into DC/DC converters 51, 52, and 53. The point at which wire 120 branches from the negative electrode of DC/DC converter 61 into DC/DC converters 51, 52, and 53 is referred to as "branch point N4".

Wire 120 includes the following paths. The path before branching, which connects branch point N4 and the negative electrode of DC/DC converter 61, is referred to as "path 120a". One of the paths after branching, which connects branch point N4 and DC/DC converter 51, is referred to as "path 120c". One of the paths after branching, which connects branch point N4 and DC/DC converter 52, is referred to as "path 120d". One of the paths after branching, which connects branch point N4 and DC/DC converter 53" is referred to as "path 120b".

Wires 110 and 120 penetrate magnetic core 21. A part (i.e., a path) of wire 110 penetrating magnetic core 21 is referred to as "path 110a". A part (i.e., a path) of wire 120 penetrating magnetic core 21 is referred to as "path 120a". Passing through wire 110 connecting DC/DC converter 61 and DC/DC converters 51, 52, and 53, path 110a can also be regarded as connecting DC/DC converter 61 and DC/DC converters 51, 52, and 53. Path 110a is an example of the "first path" connecting DC/DC converter 61 and DC/DC converters 51, 52, and 53. Passing through wire 120 connecting DC/DC converter 61 and DC/DC converters 51, 52, and 53, path 120a can also be regarded as connecting DC/DC converter 61 and DC/DC converters 51, 52, and 53. Path 120a is an example of the "second path" connecting DC/DC converter 61 and DC/DC converters 51, 52, and 53.

Inverter 62 converts the DC power fed from DC/DC converter 61 into AC power and outputs the resultant AC power. Inverter 62 employs, for example, maximum power point tracking (MPPT) and adjusts the current and voltage of the DC power fed from DC/DC converter 61 so that the electric power is a maximum value. For example, inverter 62 converts DC power into AC power with a voltage of 100V and a frequency of 50 Hz or 60 Hz. The AC power is used for household or other electronic devices.

Arc detection device 10a has the same function as in Embodiment 1. Except that magnetic core 21 is penetrated by paths 110a and 120a, arc detection device 10a corresponds to that in Embodiment 1 and detailed description thereof will thus be omitted. Like Embodiment 1, Embodiment 2 provides the advantage of detecting an arc accurately.

As described above, solar inverter 60a includes arc detection device 10a and a converter (e.g., inverter 62) that converts electric power output from DC power source (e.g., DC/DC converter 61).

In this manner, arc detection device 10a may be included in solar inverter 60a to provide solar inverter 60a capable of detecting an arc accurately.

Note that wires 110 and 120 are each a branching wire (hereinafter referred to as a "branch wire") and an arc may occur in each of the path of each branch wire before branching and the plurality of paths of each branch wire after branching. However, magnetic core 21 included in arc detection device 10a is penetrated by the path (specifically, path 110a) before branching. Even if an arc occurs in any of the plurality of paths (e.g., paths 110b, 110c, 110d, 120b, 120c, and 120d), a high frequency component generated by the arc flows through the path before branching, which penetrates magnetic core 21. The arc can thus be detected based on a current detected by detects current detector 20a that detects a current flowing through each path penetrating magnetic core 21.

(Variation of Embodiment 2)

In Embodiment 2, an example has been described where a path before branching penetrates magnetic core 21 included in current detector 20a. The configuration is not limited thereto. This will be described with reference to FIG. 6B.

Figure 6B:
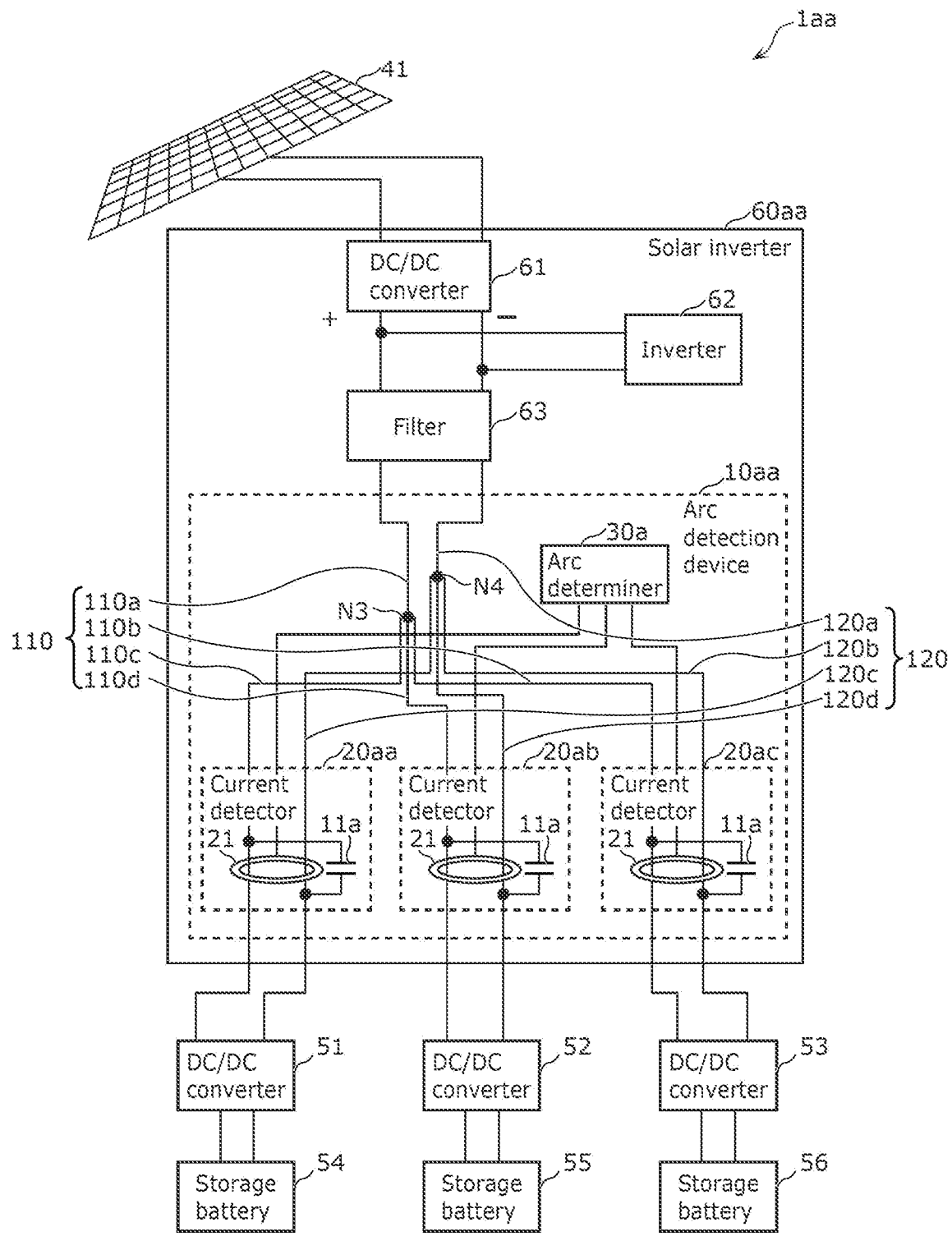
FIG. 6B is a configuration diagram showing an example solar power system according to Variation of Embodiment 2.

FIG. 6B is a configuration diagram showing example solar power system 1aa according to Variation of Embodiment 2.

Solar power system 1aa differs from solar power system 1a according to Embodiment 2 in including solar inverter 60aa in place of solar inverter 60a. In other respects, solar power system 1aa is the same as solar power system 1a according to Embodiment 2 and description thereof will thus be omitted.

Solar inverter 60aa differs from solar inverter 60a according to Embodiment 2 in including arc detection device 10aa in place of arc detection device 10a. In other respects, solar inverter 60aa is the same as solar inverter 60a according to Embodiment 2 and description thereof will thus be omitted.

Arc detection device 10aa includes current detectors 20aa, 20ab, and 20ac as well as arc determiner 30a.

Current detector 20aa has the same function as current detector 20a according to Embodiment 1. Except that magnetic core 21 is penetrated by paths 110c and 120c, current detector 20aa corresponds to current detector 20a in Embodiment 1 and detailed description thereof will thus be omitted. Current detector 20ab has the same function as current detector 20a according to Embodiment 1. Except that magnetic core 21 is penetrated by paths 110d and 120d, current detector 20ab corresponds to current detector 20a in Embodiment 1 and detailed description thereof will thus be omitted. Current detector 20ac has the same function as current detector 20a according to Embodiment 1. Except that magnetic core 21 is penetrated by paths 110b and 120b, current detector 20ac corresponds to current detector 20a in Embodiment 1 and detailed description thereof will thus be omitted.

Like arc determiner 30, arc determiner 30a is a microcomputer, for example, but may be implemented as hardware by a dedicated electronic circuit.

Arc determiner 30a determines the occurrence of an arc based on a current detected by each of current detectors 20aa, 20ab, and 20ac. For example, arc determiner 30a performs frequency analysis of a current detected by current detector 20aa to determine the occurrence of an arc at path 110c or 120c. Arc determiner 30a performs frequency analysis of a current detected by current detector 20ab to determine the occurrence of an arc at path 110d or 120d. Arc determiner 30a performs frequency analysis of a current detected by current detector 20ac to determine the occurrence of an arc at path 110b or 120b.

Accordingly, even an arc occurring in any of the plurality of paths (e.g., paths 110b, 110c, 110d, 120b, 120c, and 120d) after branching can be detected based on a current detected by current detector 20aa, 20ab, or 20ac, since the paths after branching penetrate magnetic core 21. In particular, in which of the paths after branching the arc occurs can be specified.

Embodiment 3

In Embodiment 2, an example has been described where solar inverter 60a includes arc detection device 10a according to Embodiment 1. Alternatively, solar inverter may include arc detection device 10c according to Variation 2 of Embodiment 1. This will be described with reference to FIG. 7A.

Figure 7A:
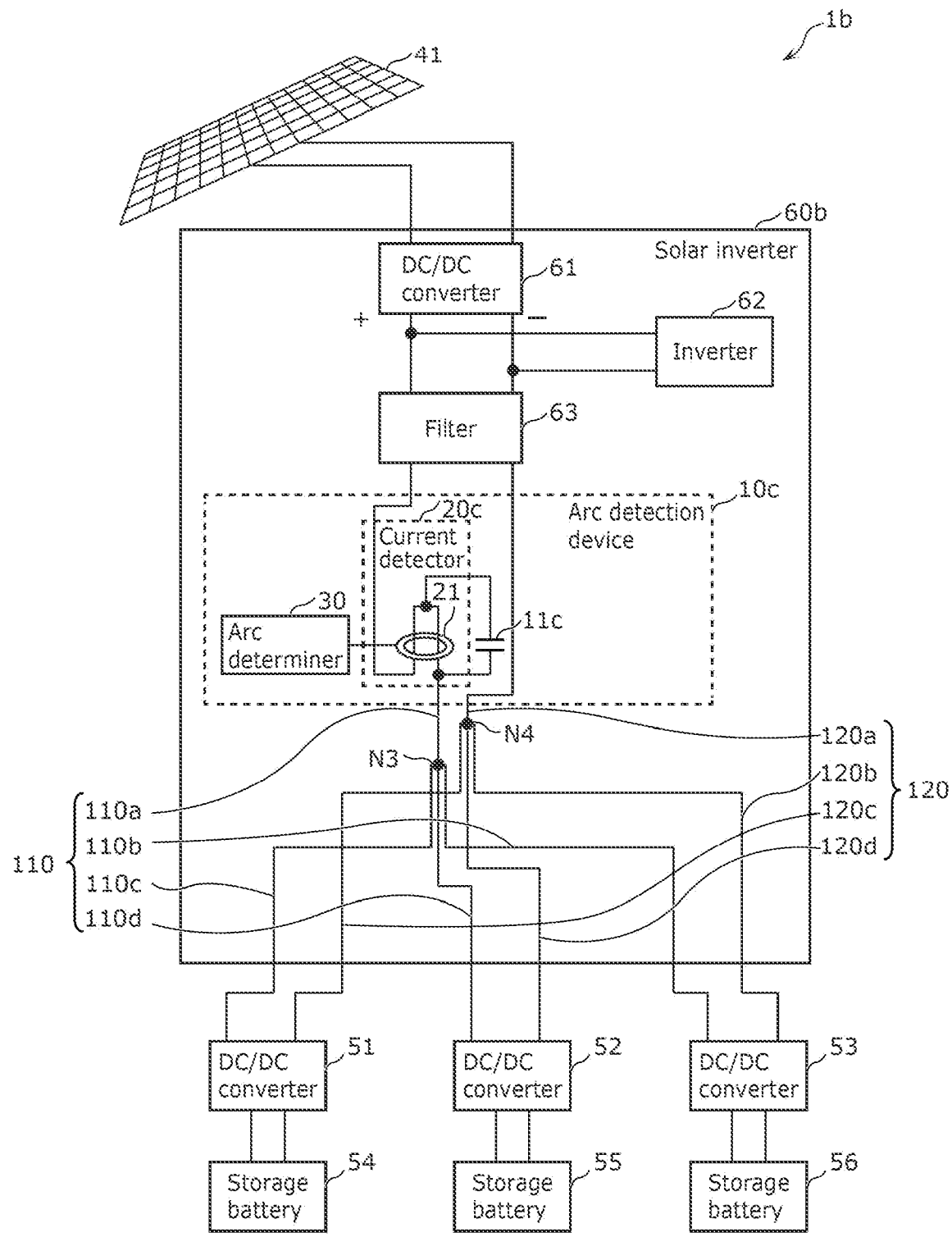
FIG. 7A is a configuration diagram showing an example solar power system according to Embodiment 3.

FIG. 7A is a configuration diagram showing example solar power system 1b according to Embodiment 3.

Solar power system 1b differs from solar power system 1a according to Embodiment 2 in including solar inverter 60b in place of solar inverter 60a. In other respects, solar power system 1b is the same as solar power system 1a according to Embodiment 2 and description thereof will thus be omitted.

Solar inverter 60b differs from solar inverter 60a according to Embodiment 2 in including arc detection device 10c in place of arc detection device 10a. In other respects, solar inverter 60b is the same as solar inverter 60a according to Embodiment 2 and description thereof will thus be omitted.

Arc detection device 10c has the same function as in Variation 2 of Embodiment 1. Except that magnetic core 21 is penetrated by path 110a, arc detection device 10c corresponds to that in Variation 2 of Embodiment 1 and detailed description thereof will thus be omitted. Like Variation 2 of Embodiment 1, Embodiment 3 provides the advantage of detecting an arc accurately.

(Variation of Embodiment 3)

An example has been described in Embodiment 3 where a path before branching penetrates magnetic core 21 included in current detector 20c. The configuration is not limited thereto. This will be described with reference to FIG. 7B.

Figure 7B:
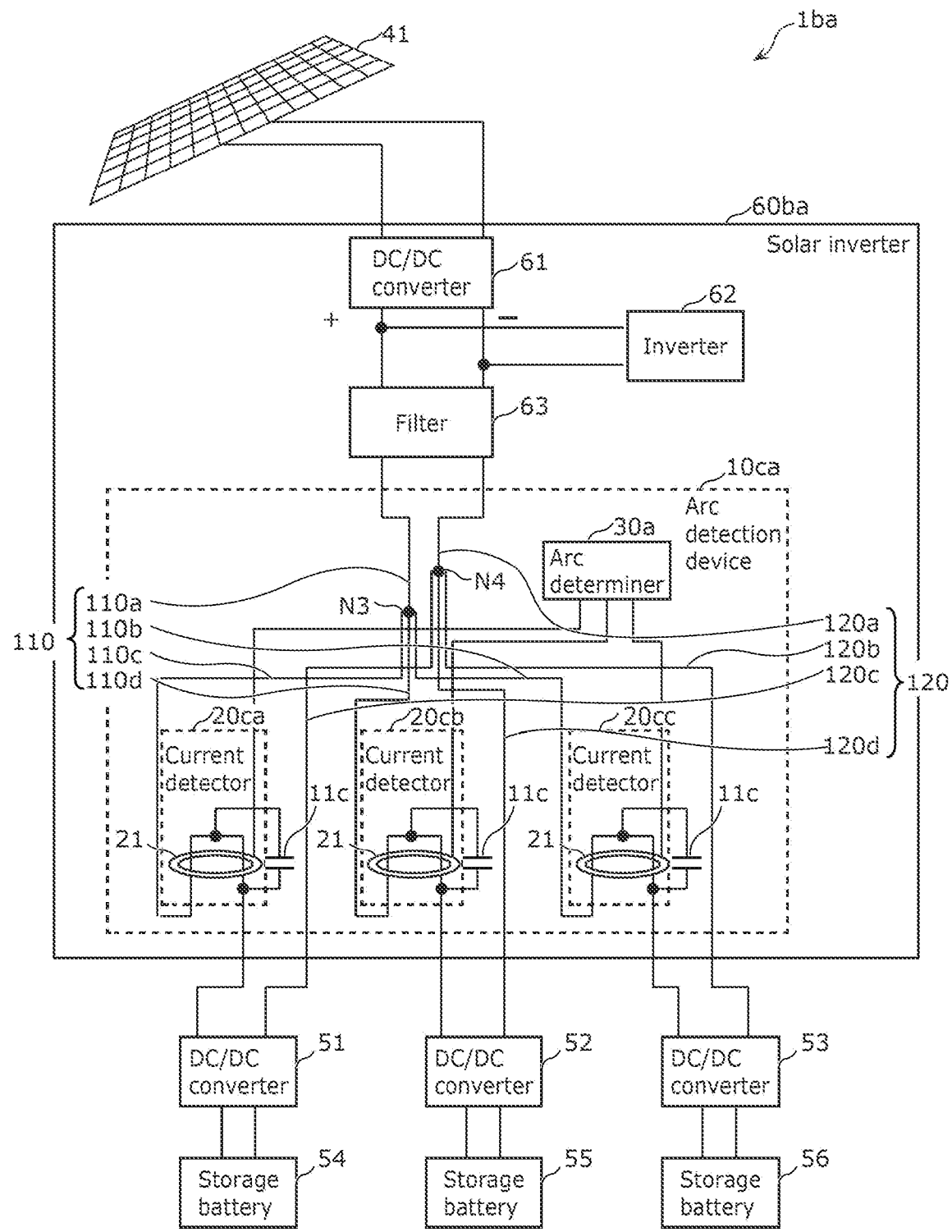
FIG. 7B is a configuration diagram showing an example solar power system according to Variation of Embodiment 3.

FIG. 7B is a configuration diagram showing example solar power system 1ba according to Variation of Embodiment 3.

Solar power system 1ba differs from solar power system 1b according to Embodiment 3 in including solar inverter 60ba in place of solar inverter 60b. In other respects, solar power system 1ba is the same as solar power system 1b according to Embodiment 3 and description thereof will thus be omitted.

Solar inverter 60ba differs from solar inverter 60b according to Embodiment 3 in including arc detection device 10ca in place of arc detection device 10c. In other respects, solar inverter 60ba is the same as solar inverter 60b according to Embodiment 3 and description thereof will thus be omitted.

Arc detection device 10ca includes current detectors 20ca, 20cb, and 20cc as well as arc determiner 30a.

Current detector 20ca has the same function as current detector 20c according to Variation 2 of Embodiment 1. Except that magnetic core 21 is penetrated by path 110c, current detector 20ca corresponds to current detector 20c in Variation 2 of Embodiment 1 and detailed description thereof will thus be omitted. Current detector 20cb has the same function as current detector 20c according to Variation 2 of Embodiment 1. Except that magnetic core 21 is penetrated by path 110d, current detector 20cb corresponds to current detector 20c in Variation 2 of Embodiment 1 and detailed description thereof will thus be omitted. Current detector 20cc has the same function as current detector 20c according to Variation 2 of Embodiment 1. Except that magnetic core 21 is penetrated by path 110b, current detector 20cc corresponds to current detector 20c in Variation 2 of Embodiment 1 and detailed description thereof will thus be omitted.

Arc determiner 30a determines the occurrence of an arc based on a current detected by each of current detectors 20ca, 20cb, and 20cc. For example, arc determiner 30a performs frequency analysis of a current detected by current detector 20ca to determine the occurrence of an arc at path 110c or 120c. Arc determiner 30a performs frequency analysis of a current detected by current detector 20cb to determine the occurrence of an arc at path 110d or 120d. Arc determiner 30a performs frequency analysis of a current detected by current detector 20cc to determine the occurrence of an arc at path 110b or 120b.

Accordingly, even an arc occurring in any of the plurality of paths (e.g., paths 110b, 110c, 110d, 120b, 120c, and 120d) after branching can be detected based on a current detected by current detector 20ca, 20cb, or 20cc, since the paths after branching penetrate magnetic core 21. In particular, in which of the paths after branching the arc occurs can be specified.

Embodiment 4

In Embodiment 2, an example has been described where solar inverter 60a includes arc detection device 10a according to Embodiment 1. Alternatively, solar inverter may include arc detection device 10d according to Variation 3 of Embodiment 1. This will be described with reference to FIG. 8A.

Figure 8A:
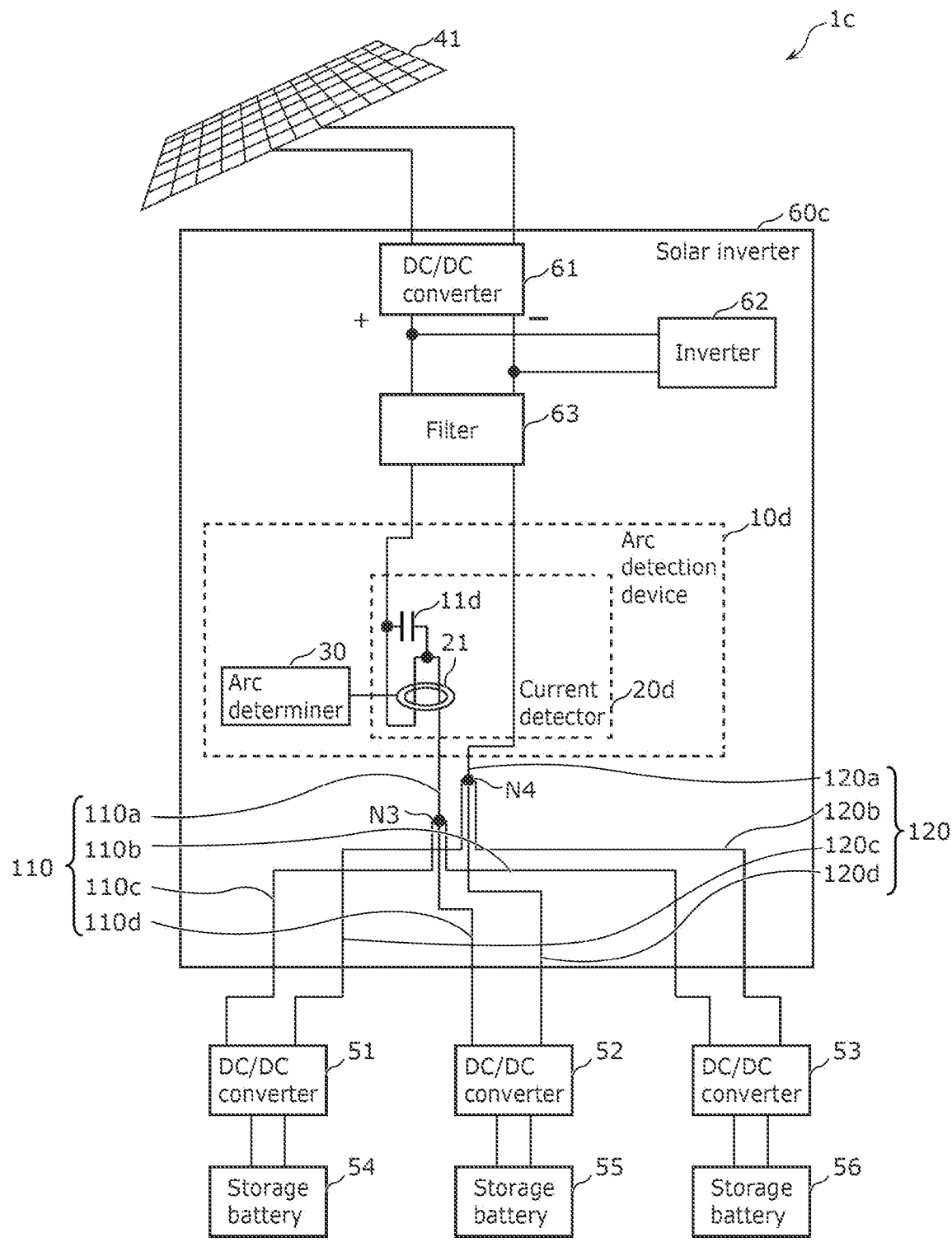
FIG. 8A is a configuration diagram showing an example solar power system according to Embodiment 4.

FIG. 8A is a configuration diagram showing example solar power system 1c according to Embodiment 4.

Solar power system 1c differs from solar power system 1a according to Embodiment 2 in including solar inverter 60c in place of solar inverter 60a. In other respects, solar power system 1c is the same as solar power system 1a according to Embodiment 2 and description thereof will thus be omitted.

Solar inverter 60c differs from solar inverter 60a according to Embodiment 2 in including arc detection device 10d in place of arc detection device 10a. In other respects, solar inverter 60c is the same as solar inverter 60a according to Embodiment 2 and description thereof will thus be omitted.

Arc detection device 10d has the same function as in Variation 3 of Embodiment 1. Except that magnetic core 21 is penetrated by path 110a, arc detection device 10d corresponds to that in Variation 3 of Embodiment 1 and detailed description thereof will thus be omitted. Like Variation 3 of Embodiment 1, Embodiment 4 provides the advantage of detecting an arc accurately.

(Variation of Embodiment 4) In Embodiment 4, an example has been described where a path before branching penetrates magnetic core 21 included in current detector 20d. The configuration is not limited thereto. This will be described with reference to FIG. 8B.

Figure 8B:
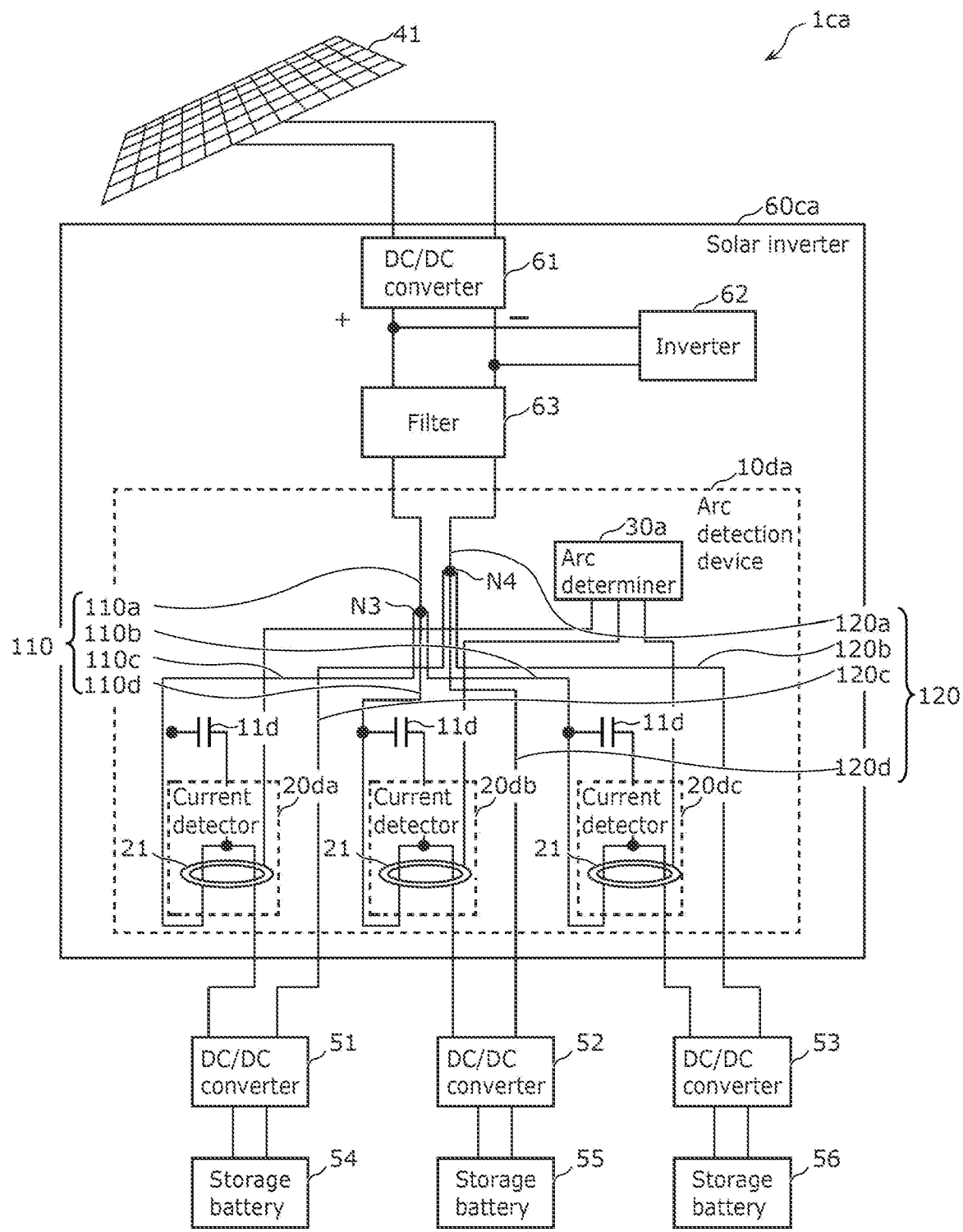
FIG. 8B is a configuration diagram showing an example solar power system according to Variation of Embodiment 4.

FIG. 8B is a configuration diagram showing example solar power system 1ca according to Variation of Embodiment 4.

Solar power system 1ca differs from solar power system 1c according to Embodiment 4 in including solar inverter 60ca in place of solar inverter 60c. In other respects, solar power system 1ca is the same as solar power system 1c according to Embodiment 4 and description thereof will thus be omitted.

Solar inverter 60ca differs from solar inverter 60c according to Embodiment 4 in including arc detection device 10da in place of arc detection device 10d. In other respects, solar inverter 60ca is the same as solar inverter 60c according to Embodiment 4 and description thereof will thus be omitted.

Arc detection device 10da includes current detectors 20da, 20db, and 20dc as well as arc determiner 30a.

Current detector 20da has the same function as current detector 20d according to Variation 3 of Embodiment 1. Except that magnetic core 21 is penetrated by path 110c, current detector 20da corresponds to current detector 20d in Variation 3 of Embodiment 1 and detailed description thereof will thus be omitted. Current detector 20db has the same function as current detector 20d according to Variation 3 of Embodiment 1. Except that magnetic core 21 is penetrated by path 110d, current detector 20db corresponds to current detector 20d in Variation 3 of Embodiment 1 and detailed description thereof will thus be omitted. Current detector 20dc has the same function as current detector 20d according to Variation 3 of Embodiment 1. Except that magnetic core 21 is penetrated by path 110b, current detector 20dc corresponds to current detector 20d in Variation 3 of Embodiment 1 and detailed description thereof will thus be omitted.

Arc determiner 30a determines the occurrence of an arc based on a current detected by each of current detectors 20da, 20db, and 20dc. For example, arc determiner 30a performs frequency analysis of a current detected by current detector 20da to determine the occurrence of an arc at path 110c or 120c. Arc determiner 30a performs frequency analysis of a current detected by current detector 20db to determine the occurrence of an arc at path 110d or 120d. Arc determiner 30a performs frequency analysis of a current detected by current detector 20dc to determine the occurrence of an arc at path 110b or 120b.

Accordingly, even an arc occurring in any of the plurality of paths (e.g., paths 110b, 110c, 110d, 120b, 120c, and 120d) after branching can be detected based on a current detected by current detector 20da, 20db, or 20dc, since the paths after branching penetrate magnetic core 21. In particular, in which of the paths after branching the arc occurs can be specified.

Embodiment 5

In Embodiment 2, an example has been described where solar inverter 60a includes arc detection device 10a according to Embodiment 1. Alternatively, a solar inverter may include arc detection device 10e according to Variation 4 of Embodiment 1. This will be described with reference to FIG. 9A.

Figure 9A:
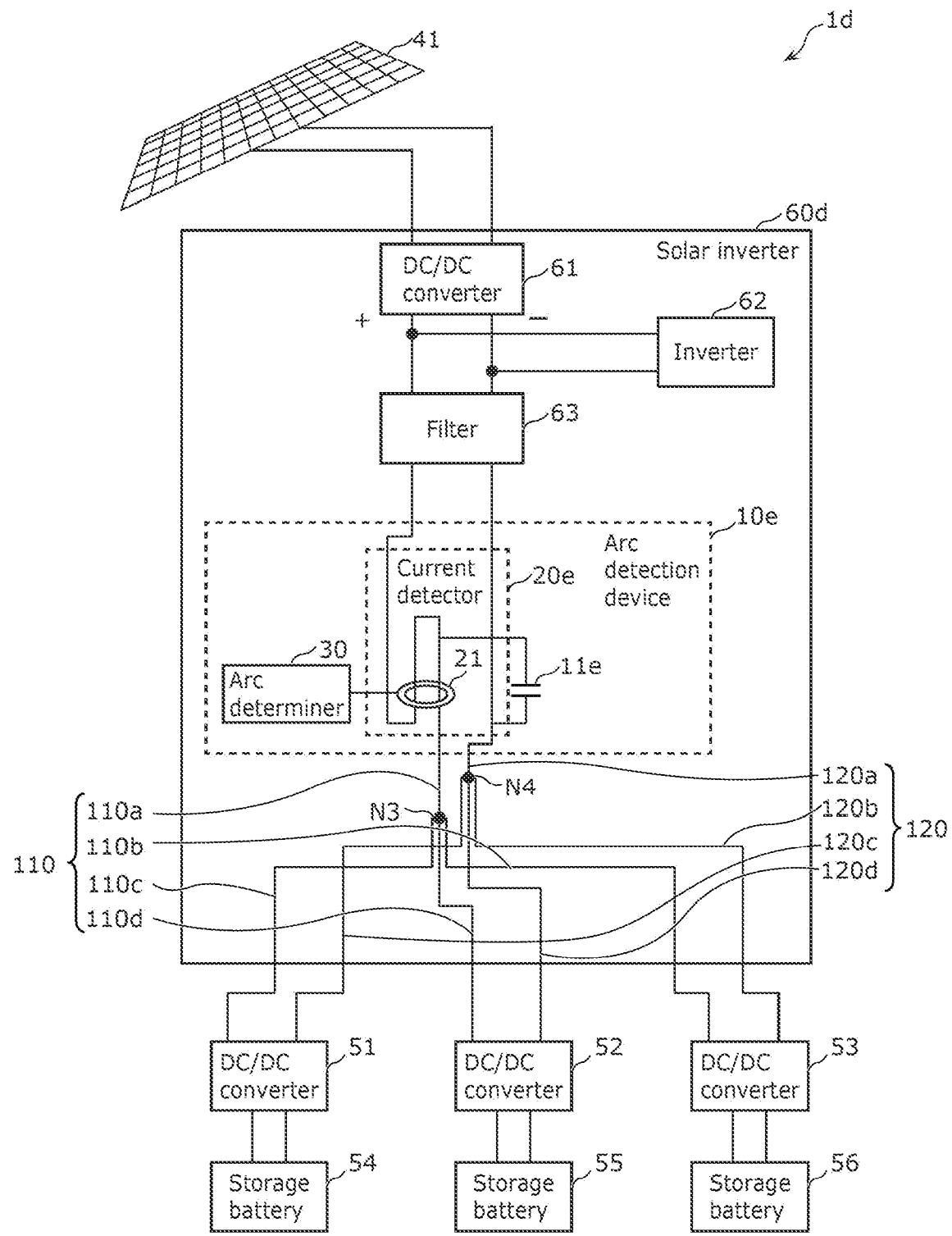
FIG. 9A is a configuration diagram showing an example solar power system according to Embodiment 5.

FIG. 9A is a configuration diagram showing example solar power system 1d according to Embodiment 5.

Solar power system 1d differs from solar power system 1a according to Embodiment 2 in including solar inverter 60d in place of solar inverter 60a. In other respects, solar power system 1d is the same as solar power system 1a according to Embodiment 2 and description thereof will thus be omitted.

Solar inverter 60d differs from solar inverter 60a according to Embodiment 2 in including arc detection device 10e in place of arc detection device 10a. In other respects, solar inverter 60d is the same as solar inverter 60a according to Embodiment 2 and description thereof will thus be omitted.

Arc detection device 10e has the same function as in Variation 4 of Embodiment 1. Except that magnetic core 21 is penetrated by path 110a, arc detection device 10e corresponds to that in Variation 4 of Embodiment 1 and detailed description thereof will thus be omitted. Like Variation 4 of Embodiment 1, Embodiment 5 provides the advantage of detecting an arc accurately.

(Variation of Embodiment 5)

In Embodiment 5, an example has been described where a path before branching penetrates magnetic core 21 included in current detector 20e. The configuration is not limited thereto. This will be described with reference to FIG. 9B.

Figure 9B:
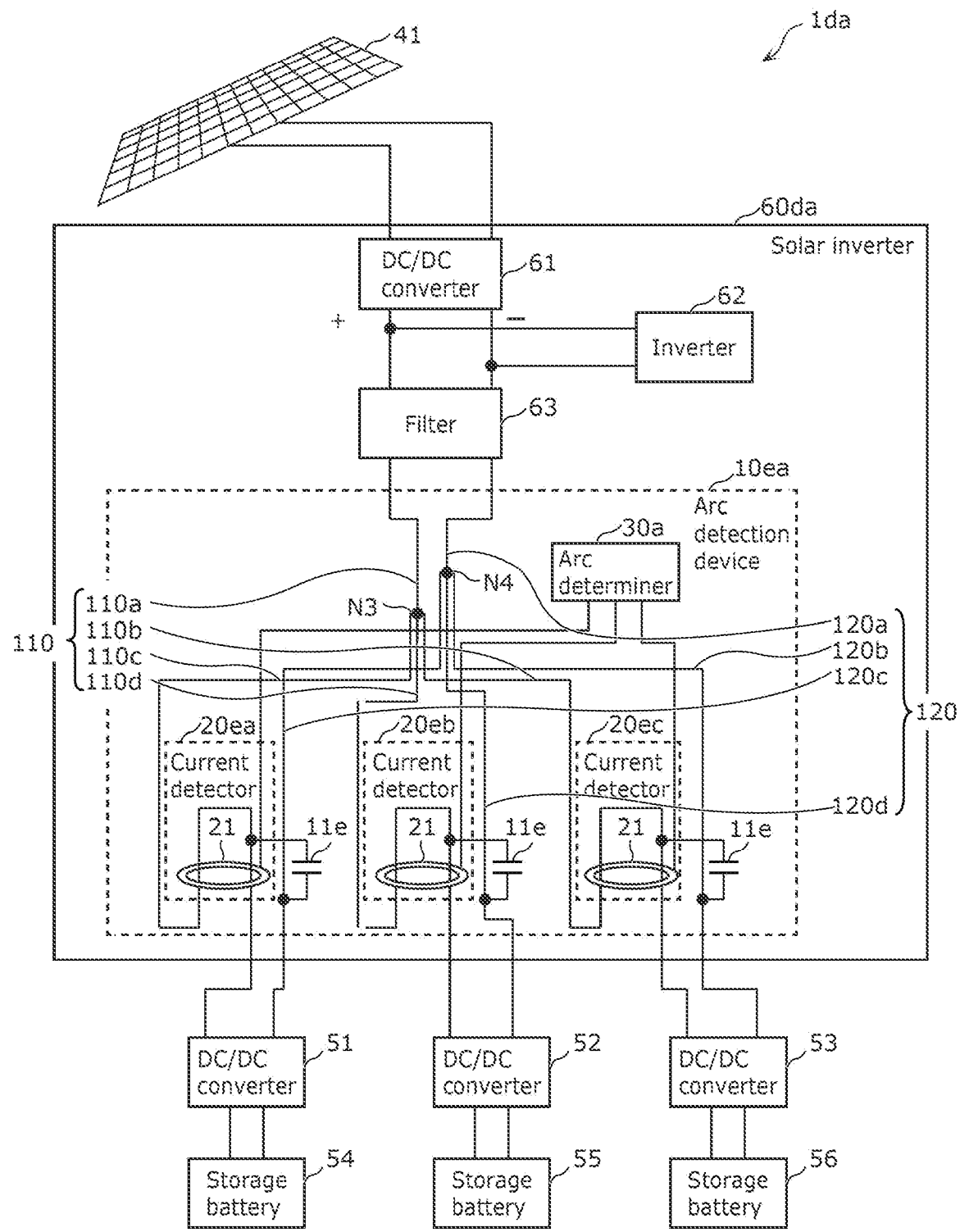
FIG. 9B is a configuration diagram showing an example solar power system according to Variation of Embodiment 5.

FIG. 9B is a configuration diagram showing example solar power system 1da according to Variation of Embodiment 5.

Solar power system 1da differs from solar power system 1d according to Embodiment 5 in including solar inverter 60da in place of solar inverter 60d. In other respects, solar power system 1da is the same as solar power system 1d according to Embodiment 5 and description thereof will thus be omitted.

Solar inverter 60da differs from solar inverter 60d according to Embodiment 5 in including arc detection device 10ea in place of arc detection device 10e. In other respects, solar inverter 60da is the same as solar inverter 60d according to Embodiment 5 and description thereof will thus be omitted.

Arc detection device 10ea includes current detectors 20ea, 20eb, and 20ec as well as arc determiner 30a.

Current detector 20ea has the same function as current detector 20e according to Variation 4 of Embodiment 1. Except that magnetic core 21 is penetrated by path 110c, current detector 20ea corresponds to current detector 20e in Variation 4 of Embodiment 1 and detailed description thereof will thus be omitted. Current detector 20eb has the same function as current detector 20e according to Variation 4 of Embodiment 1. Except that magnetic core 21 is penetrated by path 110d, current detector 20eb corresponds to current detector 20e in Variation 4 of Embodiment 1 and detailed description thereof will thus be omitted. Current detector 20ec has the same function as current detector 20e according to Variation 4 of Embodiment 1. Except that magnetic core 21 is penetrated by path 110b, current detector 20ec corresponds to current detector 20e in Variation 4 of Embodiment 1 and detailed description thereof will thus be omitted.

Arc determiner 30a determines the occurrence of an arc based on a current detected by each of current detectors 20ea, 20eb, and 20ec. For example, arc determiner 30a performs frequency analysis of a current detected by current detector 20ea to determine the occurrence of an arc at path 110c or 120c. Arc determiner 30a performs frequency analysis of a current detected by current detector 20eb to determine the occurrence of an arc at path 110d or 120d. Arc determiner 30a performs frequency analysis of a current detected by current detector 20ec to determine the occurrence of an arc at path 110b or 120b.

Accordingly, even an arc occurring in any of the plurality of paths (e.g., paths 110b, 110c, 110d, 120b, 120c, and 120d) after branching can be detected based on a current detected by current detector 20ea, 20eb, or 20ec, since the paths after branching penetrate magnetic core 21. In particular, in which of the paths after branching the arc occurs can be specified.

Embodiment 6

The arc detection device may be included in an indoor wiring system. This will be described with reference to FIG. 10.

Figure 10:
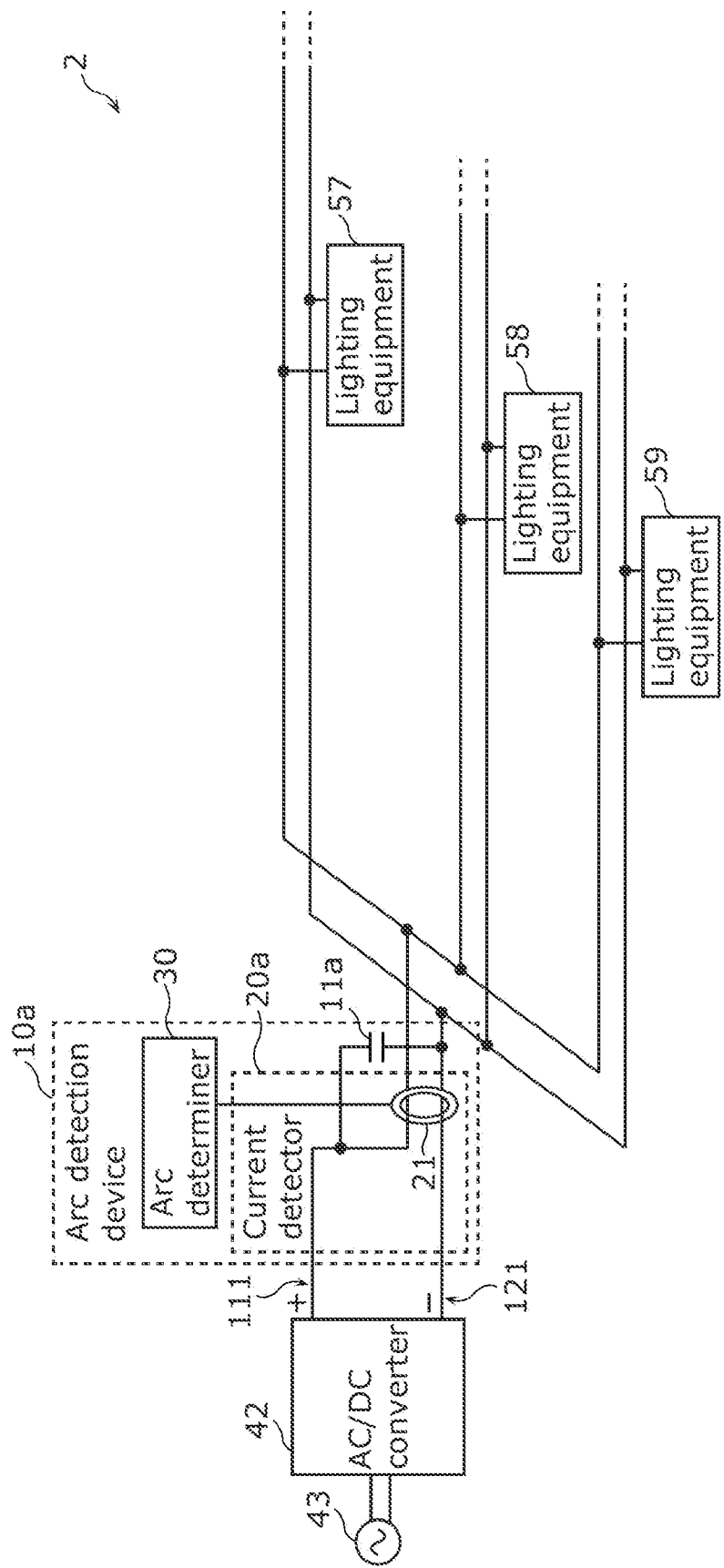
FIG. 10 is a configuration diagram showing an example indoor wiring system according to Embodiment 6.

FIG. 10 is a configuration diagram showing example indoor wiring system 2 according to Embodiment 6. Note that FIG. 10 also shows system power source 43 connected to indoor wiring system 2.

System power source 43 feeds AC power generated by a power plant or other facilities.

Indoor wiring system 2 includes AC/DC converter 42, wires 111 and 121, lighting equipment 57, 58, and 59 as well as arc detection device 10a. AC/DC converter 42, wires 111 and 121, lighting equipment 57, 58, and 59 as well as arc detection device 10a are placed indoors in a facility such as a detached house, an apartment building, a building, or a factory.

AC/DC converter 42 is an electric power converter that is fed with AC power from system power source 43, converts the fed AC power into DC power, and outputs the resultant PC power. Outputting DC power, AC/DC converter 42 can be regarded as a DC power source.

AC/DC converter 42 converts the AC power fed from system power source 43 into DC power and outputs the resultant DC power to lighting equipment 57, 58, and 59. AC/DC converter 42 includes a positive electrode and a negative electrode. The positive electrode is connected to wire 111, while the negative electrode is connected to wire 121.

Wires 111 and 121 connect AC/DC converter 42 and lighting equipment 57, 58, and 59. Lighting equipment 57, 58, and 59 are each an example of the "device" connected to AC/DC converter 42 via wires 111 and 121. Wire 111 is an example of the "first wire" connected to one of the positive and negative electrodes of AC/DC converter 42. Here, wire 111 is connected to the positive electrode as the one of the positive and negative electrodes of AC/DC converter 42. Wire 121 is an example of the "second wire" connected to the other of the positive and negative electrodes of AC/DC converter 42. Here, wire 121 is connected to the negative electrode as the other of the positive and negative electrodes of AC/DC converter 42.

Like wire 110 according to Embodiment 2 or other embodiments, wire 111 branches from the positive electrode of AC/DC converter 42 into lighting equipment 57, 58, and 59. Like wire 120 according to Embodiment 2 or other embodiments, wire 121 branches from the negative electrode of AC/DC converter 42 into lighting equipment 57, 58, and 59.

Note that the device is not limited to lighting equipment. As long as being placed indoors, the device is not particularly limited. For example, a device may be a speaker, microphone, or any other suitable device.

Wires 111 and 121 penetrate magnetic core 21. The paths of wires 111 and 121 before branching penetrate magnetic core 21. The path of wire 111 before branching is an example of the "first path" connecting AC/DC converter 42 and lighting equipment 57, 58, and 59. The path of wire 121 before branching is an example of the "second path" connecting AC/DC converter 42 and lighting equipment 57, 58, and 59.

Arc detection device 10a has the same function as in Embodiment 1. Except that magnetic core 21 is penetrated by the paths of wires 111 and 121 before branching, arc detection device 10a corresponds to that is Embodiment 1 and detailed description thereof will thus be omitted. Like Embodiment 1, Embodiment 6 provides the advantage of detecting an arc accurately.

As described above, indoor wiring system 2 includes arc detection device 10a, a first path (e.g., the path of wire 111 before branching), a second path (e.g., the path of wire 121 before branching), and a device (e.g., lighting equipment 57, 58, and 59) placed indoors.

In this manner, arc detection device 10a may be included in indoor wiring system 2 to provide indoor wiring system 2 capable of detecting an arc accurately.

As in Embodiment 2, wires 111 and 121 are each a branch wire and an arc may occur in each of the path of each branch wire before branching and the plurality of paths of each branch wire after branching. However, magnetic core 21 included in arc detection device 10a is penetrated by the path before branching. Even if an arc occurs in any of the plurality of paths after branching, a high frequency component generated by the arc flows through the path before branching, which penetrates magnetic core 21. The arc can thus be detected based on a current detected by detects current detector 20a that detects a current flowing through each path penetrating magnetic core 21.

As in Variation of Embodiment 2, an arc detection device may also be placed in each path after branching in indoor wiring system 2.

The arc detection devices according to Variations 1 to 4 of Embodiment may be included in an indoor wiring system.

Other Embodiments

While the arc detection device, for example, according to the embodiments has been described above, the present invention is not limited to the embodiments.

For example, applicable as the low impedance circuit may be a capacitor included in a device connected to a DC power source.

For example, an example has been described in Variations 2 to 4 of Embodiment 1 where the first wire, which penetrates magnetic core 21 once and then turns around to penetrate magnetic core 21 again, is connected to the positive electrode of DC power source 40. The first wire may be connected to the negative electrode of DC power source 40. That is, the first wire connected to the negative electrode as the one of the positive and negative electrodes of DC power source 40 may penetrate magnetic core 21 once and then turns around to penetrate magnetic core 21 again.

For example, an example has been described above in the embodiments where the arc detection device is applied to a solar power system (specifically, a solar inverter) and an indoor wiring system, an example application is not limited thereto. Another example application of the detection device (i.e., an arc detection device capable of detecting an arc accurately) according to the present invention will be described with reference to FIG. 11.

FIG. 11 illustrates an example application of the arc detection device according to the present invention.

The arc detection device according to the present invention is, for example, applied to each component of a system that converts DC power fed from solar panels 310 via wires into AC power in solar inverter 500. Here, a plurality of (e.g., three) wires (strings) 600 each connecting a plurality of (e.g., three) solar panels 310 in series are arranged to form solar cell array 300. The plurality of wires 600 are collected by junction box 400 and connected to solar inverter 500. Solar panels 310 are the DC power sources. Wires 600 are the first and second paths.

For example, wires 600 are provided with respective breakers 410. Here, breakers 410 are located inside junction box 400. Note that breakers 410 are not necessarily located inside junction box 400. For example, breakers 410 may be interposed between junction box 400 and solar cell array 300 and may be interposed between junction box 400 and solar inverter 500 without being provided for respective wires 600.

Each solar panel 310 includes, for example, solar panel-attached module 320 that converts a signal output from solar panel 310. Solar panel-attached module 320 is, for example, a DC/DC converter that adjusts the amount of power to be generated by each solar panel 310 most suitably. Note that each solar panel 310 not necessarily includes solar panel-attached module 320.

For example, each breaker 410 may include an arc detection device. Each breaker 410 blocks a current flowing through corresponding wire 600 upon determination of an anomaly.

For example, each solar panel 310 or solar panel-attached module 320 may include an arc detection device. Each solar panel 310 or solar panel-attached module 320 stops output to corresponding wire 600 upon determination of the occurrence of an arc.

For example, junction box 400 may include an arc detection device. Junction box 400 blocks a current flowing through each wire 600, for example, via corresponding breaker 410 or any other suitable element upon determination of the occurrence of an arc.

Note that an application of the arc detection device according to the present invention is not limited thereto. The arc detection device is widely applicable to systems requiring detection of an arc.

In this manner, each breaker 410 may include the arc detection device and block the flow of a current flowing through each of first and second paths upon determination of the occurrence of an arc. Each solar panel 310 may include the arc detection device and generate electricity from sunlight. Each solar panel-attached module 320 may include the arc detection device and convert a signal output from corresponding solar panel 310. Junction box 400 may include the arc detection device and connect solar panels 310 and solar inverter 500.

For example, an arc determiner included in the arc detection device may be implemented as software in a general-purpose computer such as a personal computer.

Besides, the present invention includes forms obtained by various modifications to the foregoing embodiments that can be conceived by those skilled in the art or forms achieved by freely combining the constituent elements and functions in the foregoing embodiments without departing from the scope and spirit of the present invention.

The invention claimed is:

1. An arc detection device comprising:
a current detector that includes a magnetic core penetrated by a first path and a second path each connecting a direct current (DC) power source and a device, and detects a current flowing through each of the first path and the second path in accordance with a magnetic field generated at the magnetic core;
a low impedance circuit having a lower impedance than impedances of the DC power source and the device, the low impedance circuit being connected to the first path and the second path to cause a high frequency component to bypass one of the first path or the second path; and
an arc determiner that determines an occurrence of an arc based on the current detected by the current detector, wherein
in the magnetic core, a direct current flows through the first path in a direction opposite to a direction in which a direct current flows through the second path.

2. The arc detection device according to claim 1, wherein the DC power source feeds electric power to the device via a first wire and a second wire, the first wire being connected to one of a positive electrode and a negative electrode of the DC power source, the second wire being connected to another one of the positive electrode and the negative electrode of the DC power source,
the first path passes through the first wire, and
the second path passes through the second wire.

3. The arc detection device according to claim 2, wherein the low impedance circuit is placed in a bypass path connecting connection points, one of the connection points being on the first wire between one of the positive electrode and the negative electrode of the DC power source and the magnetic core, another one of the connection points being on the second wire between the magnetic core and the device.

4. The arc detection device according to claim 1, wherein the DC power source feeds electric power to the device via a first wire and a second wire, the first wire being connected to one of a positive electrode and a negative electrode of the DC power source, the second wire being connected to another one of the positive electrode and the negative electrode of the DC power source, and the first path and the second path pass through the first wire,
the first wire penetrates the magnetic core from one side to another side of the magnetic core and then turns around in the first path, and penetrates the magnetic core from the another side to the one side of the magnetic core in the second path.

5. The arc detection device according to claim 4, wherein the low impedance circuit is placed in a bypass path connecting a connection point in the turnaround and a connection point on the first wire between the one side of the magnetic core and the device.

6. The arc detection device according to claim 4, wherein the low impedance circuit is placed in a bypass path connecting a connection point in the turnaround and a connection point on the first wire between the one side of the magnetic core and one of the positive electrode and the negative electrode of the DC power source.

7. The arc detection device according to claim 4, wherein the low impedance circuit is placed in a bypass path connecting a connection point in the turnaround and a connection point on the second wire.

8. A solar inverter comprising:
the arc detection device according to claim 1; and
a converter that converts electric power output from the DC power source.

9. An indoor wiring system comprising:
the arc detection device according to claim 1;
the first path;
the second path; and
the device placed indoors.

10. A breaker comprising the arc detection device according to claim 1, wherein
the breaker blocks a current flowing through each of the first wire and the second wire, when an occurrence of an arc is determined.

11. A solar panel comprising the arc detection device according to claim 1, wherein
the solar panel generates electricity from sunlight.

12. A solar panel-attached module comprising the arc detection device according to claim 1, wherein
the solar panel-attached module converts a signal output from a solar panel.

13. A junction box comprising the arc detection device according to claim 1, wherein
the junction box connects a solar panel and a solar inverter.

* * * * *